United States Patent
Lee et al.

(10) Patent No.: US 11,611,054 B2
(45) Date of Patent: Mar. 21, 2023

(54) QUANTUM DOT DEVICE AND ELECTRONIC DEVICE

(71) Applicant: SAMSUNG ELECTRONICS CO., LTD., Suwon-si (KR)

(72) Inventors: Heejae Lee, Seongnam-si (KR); Moon Gyu Han, Suwon-si (KR); Won Sik Yoon, Seoul (KR); Eun Joo Jang, Suwon-si (KR); Dae Young Chung, Suwon-si (KR); Tae Hyung Kim, Seoul (KR); Hyo Sook Jang, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 166 days.

(21) Appl. No.: 17/199,977

(22) Filed: Mar. 12, 2021

(65) Prior Publication Data

US 2021/0296608 A1    Sep. 23, 2021

(30) Foreign Application Priority Data

Mar. 17, 2020 (KR) .................. 10-2020-0032720
Mar. 12, 2021 (KR) .................. 10-2021-0032660

(51) Int. Cl.
*H01L 51/50*    (2006.01)
(52) U.S. Cl.
CPC ........ *H01L 51/5072* (2013.01); *H01L 51/502* (2013.01); *H01L 2251/5369* (2013.01)
(58) Field of Classification Search
CPC ............... H01L 51/5072; H01L 51/502; H01L 2251/5369
See application file for complete search history.

(56) References Cited

U.S. PATENT DOCUMENTS

| 7,777,407 B2 | 8/2010 | Aziz et al. |
| 9,373,823 B2 | 6/2016 | Chiba et al. |
| 2019/0103571 A1 | 4/2019 | Dong et al. |

FOREIGN PATENT DOCUMENTS

| JP | 5682877 B2 | 1/2015 |
| KR | 10-0826438 B1 | 4/2008 |
| KR | 10-1434090 B1 | 8/2014 |
| KR | 10-1437271 B1 | 8/2014 |
| KR | 10-1980979 B1 | 5/2019 |
| KR | 101980979 B1 | 5/2019 |

OTHER PUBLICATIONS

Ali Ahmadi, et al., The Alkali and Alkaline Earch Metal Doped ZnO Nanotubes: DFT Studies, Physica B 432 2014 105-110.
European Search Report dated Jul. 19, 2021, of the corresponding European Patent Application No. 21162330.1.
Sheng Cao, et al., Enhancing the Performance of Quantum Dot Light-Emitting Diodes Using Room-Temperature-Processed Ga-Doped ZnO Nanoparticles as the Electron Transport Layer, ACS Appl. Mater & Interfaces 2017, 15605-15614.

*Primary Examiner* — Anthony Ho
(74) *Attorney, Agent, or Firm* — Cantor Colburn LLP

(57) ABSTRACT

A quantum dot device including a first electrode and a second electrode each having a surface opposite the other, a quantum dot layer disposed between the first electrode and the second electrode, and an electron auxiliary layer disposed between the quantum dot layer and the second electrode, wherein the electron auxiliary layer includes inorganic nanoparticles including an alkaline-earth metal, and an alkali metal, an alkali metal compound, or a combination thereof, and an electronic device including the quantum dot device.

30 Claims, 1 Drawing Sheet

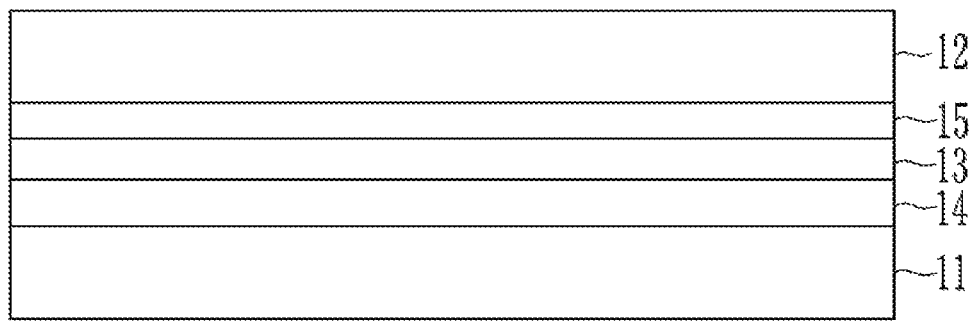

QUANTUM DOT DEVICE AND ELECTRONIC DEVICE

CROSS-REFERENCE TO RELATED APPLICATION

This application claims priority to Korean Patent Application No. 10-2020-0032720 filed in the Korean Intellectual Property Office on Mar. 17, 2020 and Korean Patent Application No. 10-2021-0032660 filed in the Korean Intellectual Property Office on Mar. 12, 2021, the contents of which in their entirety are incorporated herein by reference.

BACKGROUND

1. Field

A quantum dot device and an electronic device are disclosed.

2. Description of the Related Art

Semiconductor nanocrystals, also known as quantum dots, when supplied with photoenergy or electrical energy, may be configured to emit light of a wavelength corresponding to sizes of the quantum dots. Accordingly, the quantum dots may be used as a light emitter configured to emit light of a particular wavelength.

SUMMARY

Research on a quantum dot device using quantum dots as a light emitter is of recent interest, and thus, a new method of improving the performance of a quantum dot device is of importance.

An embodiment provides a quantum dot device capable of realizing improved performance, e.g., an improvement in light emission properties or stability, in the device.

Another embodiment provides an electronic device including the quantum dot device.

According to an embodiment, a quantum dot device includes a first electrode and a second electrode each having a surface opposite the other, a quantum dot layer disposed between the first electrode and the second electrode, and an electron auxiliary layer disposed between the quantum dot layer and the second electrode, wherein the electron auxiliary layer includes inorganic nanoparticles including an alkaline-earth metal, and an alkali metal, an alkali metal compound, or a combination thereof.

The quantum dot layer may not include cadmium.

A work function of the electron auxiliary layer may be shallower than a work function of the inorganic nanoparticles, wherein the work function is measured as a film on a silicon substrate.

The work function of the electron auxiliary layer may be about 0.01 eV to about 0.7 eV shallower than the work function of the inorganic nanoparticles, wherein the work function is measured as a film on a silicon substrate.

As a content of total alkali metal increases, the work function of the electron auxiliary layer may be shallower.

The alkali metal may include lithium (Li), sodium (Na), potassium (K), cesium (Cs), rubidium (Rb), francium (Fr), or a combination thereof.

The alkaline-earth metal may include beryllium (Be), magnesium (Mg), calcium (Ca), barium (Ba), strontium (Sr), radium (Ra), or a combination thereof.

A total of alkali metal may be present in the electron auxiliary layer in an amount of less than about 0.5 atomic percent (at %), less than or equal to about 0.45 at %, less than or equal to about 0.40 at %, less than or equal to about 0.35 at %, less than or equal to about 0.30 at %, less than or equal to about 0.25 at % or less than or equal to about 0.20 at %, based on a total number of atoms in the electron auxiliary layer.

A total of alkali metal may be present in the electron auxiliary layer in an amount of about 0.01 at % to about 0.2 at %, based on a total number of atoms in the electron auxiliary layer.

The alkali metal or the alkali metal compound present in the electron auxiliary layer may be derived from an alkali carbonate. The inorganic nanoparticles may be metal oxide nanoparticles, and the alkaline-earth metal may be present in about 0.01 at % to about 30 at %, based on the total number of metal atoms present in the metal oxide nanoparticles.

The inorganic nanoparticles may be metal oxide nanoparticles including the alkaline-earth metal and zinc.

A mole fraction of the alkaline-earth metal may be greater than a mole fraction of total alkali metal in the electron auxiliary layer, as measured by X-ray photoelectron spectroscopy (XPS).

In the electron auxiliary layer, a mole ratio of alkaline-earth metal to a total alkali metal may be greater than or equal to about 1.01:1, greater than or equal to about 1.2:1, greater than or equal to about 1.5:1, greater than or equal to about 2.0:1, or greater than or equal to about 2.5:1. In the electron auxiliary layer, a mole ratio of alkaline-earth metal to total the alkali metal, may be less than or equal to about 50:1, less than or equal to about 40:1, less than or equal to about 30:1, less than or equal to about 20:1, less than or equal to about 10:1, less than or equal to about 5:1, or less than or equal to about 3:1.

In the electron auxiliary layer, a mole ratio of alkaline-earth metal to a total alkali metal may be greater than or equal to about 1.2:1 and less than or equal to about 30:1, greater than or equal to about 2.0:1 and less than or equal to about 20:1, or greater than or equal to about 1.5:1, greater than or equal to about 2.5:1 and less than or equal to about 15:1.

The electron auxiliary layer may satisfy with the Equation 1A-1:

$$\log(ET/HL) \geq 5.50 \qquad \text{Equation 1A-1}$$

In Equation 1A-1,

ET is an amount of electrons per unit area square centimeters ($cm^2$) that transport through the electron auxiliary layer, and HL is an amount of holes per unit area square meters ($m^2$) that pass through or leak from the electron auxiliary layer.

A thickness of the electron auxiliary layer may be less than or equal to about 60 nanometers (nm).

According to an embodiment, a quantum dot device includes a first electrode and a second electrode each having a surface opposite the other, a quantum dot layer disposed between the first electrode and the second electrode, the quantum dot layer (e.g., a quantum dot light-emitting layer) including quantum dots configured to emit light (e.g., a first light) in at least a portion of a wavelength region of a visible wavelength region, and an electron auxiliary layer disposed between the quantum dot layer and the second electrode, wherein the electron auxiliary layer includes an alkaline-earth metal, and an alkali metal, an alkali metal compound (e.g., an alkali metal salt or oxide), or a combination thereof, and a total alkali metal is present in an amount of less than about 0.5 at % in the electron auxiliary layer, based on the total number of atoms in the electron auxiliary layer.

The first light may be red light, green light, or blue light. The FWHM of a peak emission in the emission spectrum of the quantum dot device may be less than or equal to about 50 nm.

The alkali metal may include lithium (Li), sodium (Na), potassium (K), cesium (Cs), rubidium (Rb), francium (Fr), or a combination thereof.

The alkali metal compound may be derived from cesium carbonate ($Cs_2CO_3$), cesium phosphate ($Cs_3PO_4$), cesium vanadate ($Cs_3VO_4$), cesium azide ($CsN_3$), lithium carbonate ($Li_2CO_3$), lithium nitride ($Li_3N$), sodium carbonate ($Na_2CO_3$), potassium carbonate ($K_2CO_3$), rubidium carbonate ($Rb_2CO_3$), or a combination thereof.

The alkali metal, the alkali metal compound, or a combination thereof may not include lithium (Li).

The alkali metal may be present as a form of an alkali metal cation.

The electron auxiliary layer may further include zinc.

The electron auxiliary layer may include metal oxide nanoparticles including the alkaline-earth metal and the zinc.

The alkaline-earth metal may be present in the metal oxide nanoparticles an amount of about 0.01 at % to about 30 at %, based on the total atom number of the alkaline-earth metal and the zinc.

In the electron auxiliary layer, a mole ratio of the alkaline-earth metal to zinc may be about 0.01:1 to about 0.5:1, about 0.1:1 to about 0.4:1, or about 0.2:1 to about 0.3:1.

A work function of the electron auxiliary layer may be shallower than a work function of the metal oxide nanoparticles.

As a content of total alkali metal in the electron auxiliary layer increases, a work function of the electron auxiliary layer may be become more shallower.

The total alkali metal may be present in about 0.01 at % to about 0.2 at % in the electron auxiliary layer, based on the total atom number of atoms in the electron auxiliary layer.

According to an embodiment, a quantum dot device includes a first electrode and a second electrode each having a surface opposite the other, a quantum dot layer disposed between the first electrode and the second electrode, and an electron auxiliary layer disposed between the quantum dot layer and the second electrode, wherein the electron auxiliary layer satisfies the Equation 1A-1 above.

According to another embodiment, an electronic device (e.g., a display device) including a quantum dot device is described above.

Characteristics of the quantum dot device may be improved.

BRIEF DESCRIPTION OF THE DRAWINGS

FIG. 1 is a schematic cross-sectional view showing a quantum dot device according to an embodiment.

DETAILED DESCRIPTION

Hereinafter, example embodiments of the present disclosure will be described in detail so that a person skilled in the art would understand the same. This disclosure may, however, be embodied in many different forms and is not construed as limited to the example embodiments set forth herein. Rather, these embodiments are provided so that this disclosure will be thorough and complete, and will fully convey the scope of the invention to those skilled in the art.

In the drawings, the thickness of layers, films, panels, regions, etc., are exaggerated for clarity. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the FIGURES are schematic in nature and their shapes are not intended to illustrate the precise shape of a region and are not intended to limit the scope of the present claims. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the FIGURES is turned over, elements described as being on the "lower" side of other elements would then be oriented on "upper" sides of the other elements. The exemplary term "lower," can therefore, encompasses both an orientation of "lower" and "upper," depending on the particular orientation of the FIGURE. Similarly, if the device in one of the FIGURES is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 10% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "total alkali metal" refers to a measured or determined amount of total alkali metal, or a measured or determined amount of total alkali metal present as two or more alkali metals, in a structural element, e.g., a layer of a device, compound, composition, or material of a device, or a compound, composition, or material used to prepare an element of a device a layer of a device. Moreover, the "total alkali metal" includes and takes into account every chemical or physical form of alkali metal(s) that is present in a structural element, compound, composition, or material, e.g., as a cation, element metal, compound, or ionic salt. The "total alkali metal" is defined as any quantifiable unit measurement, e.g., a unit of mass such as grams, units of volume or volume percent, units of moles or mole percent, or units of atoms or atomic percent.

Unless otherwise defined, the work function of semiconductor or non-conductor (excluding metal) is a difference between the vacuum level and Fermi energy, and when the vacuum level is set to "0 eV", the work function of the semiconductor or the non-conductor may be equal to the Fermi energy. Namely, the work function of semiconductor or non-conductor may be referred as Fermi energy. Unless otherwise defined, the energy level is the highest occupied molecular orbital (HOMO) energy level or the lowest unoccupied molecular orbital (LUMO) energy level. The work function of semiconductor or non-conductor may be different from LUMO energy level of the semiconductor or non-conductor.

The value of the work function (Fermi energy), HOMO energy level, or LUMO energy level is expressed as an absolute value from the vacuum level. In addition, when the work function (Fermi energy), HOMO energy level, or LUMO energy level is referred to be "deep," "high" or "large," the absolute value is large based on "0 eV" of the vacuum level, while when the work function level (Fermi energy), HOMO energy level, or LUMO energy level is referred to be "shallow," "low," or "small," the absolute value is small based on "0 eV" of the vacuum level. The HOMO energy level and work function (Fermi energy) may be measured by ultraviolet photoelectron spectroscopy (UPS), and the LUMO energy level may be calculated from an energy band gap obtained from an absorption peak and the HOMO energy level.

In an embodiment, the expression "not including cadmium (or heavy metal) as used herein may refer to including cadmium (heavy metal) substantially, for example, in an amount of less than about 100 parts per million (ppm), less than about 50 ppm, less than about 30 ppm, or less than about 20 ppm.

As used herein, "Group" may refer to a group of Periodic Table.

As used herein, "Group I" may refer to Group IA and Group IB, and examples thereof may include Li, Na, K, Rb, and Cs, but are not limited thereto.

As used herein, "Group II" may refer to Group IIA and Group IIB, and examples of a Group II metal may be Cd, Zn, Hg, and Mg, but are not limited thereto.

As used herein, "Group III" may refer to Group IIIA and Group IIIB, and examples of a Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples thereof may include nitrogen, phosphorus, arsenic, antimony, and bismuth, but are not limited thereto.

As used herein, "Group VI" may refer to Group VIA, and examples thereof may include sulfur, selenium, and tellurium, but are not limited thereto.

Hereinafter, a quantum dot device according to an embodiment is described with reference to the drawings.

The quantum dot device according to an embodiment may be a quantum dot electroluminescent device configured to emit light from quantum dots by applying an electric field to electrodes.

FIG. 1 is a schematic cross-sectional view showing a quantum dot device according to an embodiment.

Referring to FIG. 1, a quantum dot device 10 according to an embodiment includes a first electrode 11 and a second electrode 12 each having a surface opposite the other; a quantum dot layer 13 disposed between the first electrode 11 and the second electrode 12; a hole auxiliary layer 14 disposed between the first electrode 11 and the quantum dot layer 13; and an electron auxiliary layer 15 disposed between the second electrode 12 and the quantum dot layer 13.

A substrate (not shown) may be disposed under the first electrode 11 or on the second electrode 12. The substrate may be for example made of an inorganic material such as glass; an organic material such as polycarbonate, polymethyl methacrylate, polyethylene terephthalate, polyethylene naphthalate, polyamide, polyether sulfone, or a combination thereof; or a silicon wafer. The substrate may be omitted.

One of the first electrode 11 and the second electrode 12 is an anode and the other is a cathode. For example, the first electrode 11 may be an anode and the second electrode 12 may be a cathode. For example, first electrode 11 may be a cathode and the second electrode 12 may be an anode.

The first electrode 11 may be made of a conductor having relatively high work function, and may be for example made of a metal, a conductive metal oxide, or a combination thereof. The first electrode 11 may be for example made of a metal or an alloy thereof such as nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of a metal and an oxide such as ZnO and Al or $SnO_2$ and Sb, but is not limited thereto.

The second electrode 12 may be for example made of a conductor having a lower work function than the first electrode 11, and may be for example made of a metal, a conductive metal oxide, and/or a conductive polymer. The second electrode 12 may include for example a metal or an alloy thereof such as aluminum, magnesium, calcium, sodium, potassium, titanium, indium, yttrium, lithium, gadolinium silver, tin, lead, cesium, barium, and the like; a multi-layer structure material such as LiF/Al, Li$_2$O/Al, Liq/Al, LiF/Ca, and BaF$_2$/Ca, but is not limited thereto.

A work function of the first electrode 11 may be higher than that of the second electrode 12. For example, the work function of the first electrode 11 may be for example about 4.5 eV to about 5.0 eV and the work function of the second electrode 12 may be for example about 4.0 eV to about 4.7 eV. Within the ranges, the work function of the first electrode 11 may be for example about 4.6 eV to about 4.9 eV and the work function of the second electrode 12 may be for example about 4.0 eV to about 4.5 eV.

At least one of the first electrode 11 and the second electrode 12 may be a light-transmitting electrode and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 12 is a non-light-transmitting electrode, it may be made of for example an opaque conductor such as aluminum (Al), silver (Ag), or gold (Au).

The quantum dot layer 13 includes quantum dots. The quantum dots may be a semiconductor nanocrystal in a general concept, and may have various shapes, for example a sphere, a polyhedron, a pyramid, a multi-pod, a square (cube or cuboid), a rectangular parallelepiped, a nanotube, a nanorod, a nanowire, a nanosheet, or a combination thereof, but is not limited thereto. Herein, the quantum rod may indicate quantum dots having an aspect ratio of greater than about 1, for example an aspect ratio of greater than or equal to about 2, greater than or equal to about 3, or greater than or equal to about 5. For example, the quantum rod may have an aspect ratio of less than or equal to about 50, of less than or equal to about 30, or of less than or equal to about 20.

The quantum dots may have for example a particle diameter (a size of the largest portion for a non-spherical shape) of for example about 1 nanometer (nm) to about 100 nm, about 1 nm to about 80 nm, about 1 nm to about 50 nm, or about 1 nm to about 20 nm, for example, greater than or equal to about 2 nm, greater than or equal to about 3 nm, greater than or equal to about 4 nm, greater than or equal to about 5 nm, greater than or equal to about 6 nm, greater than or equal to about 7 nm, or greater than or equal to about 8 nm and less than or equal to about 50 nm, less than or equal to about 40 nm, less than or equal to about 30 nm, less than or equal to about 20 nm, less than or equal to about 15 nm, less than or equal to about 10 nm, less than or equal to about 9 nm, or less than or equal to about 8 nm. For example, an average size of the blue light emitting quantum dots may be for example less than or equal to about 4.5 nm, less than or equal to about 4.3 nm, less than or equal to about 4.2 nm, less than or equal to about 4.1 nm, or less than or equal to about 4.0 nm. Within the ranges, it may be for example about 2.0 nm to about 4.5 nm, about 2.0 nm to about 4.3 nm, about 2.0 nm to about 4.2 nm, about 2.0 about nm to about 4.1 nm, or about 2.0 nm to about 4.0 nm.

An energy bandgap of quantum dots may be adjusted according to the size or composition of the quantum dot, and thus, the light-emitting wavelength of the quantum dot may be controlled. For example, as the size of the quantum dot increases, the quantum dot may have a smaller energy bandgap and thus be configured to emit light in a relatively long wavelength region. In contrast, as the size of the quantum dot decreases, the quantum dot may have larger energy bandgap and thus be configured to emit light in a relatively short wavelength region. For example, the quantum dots may be configured to emit light of a predetermined wavelength region in a visible wavelength region according to its size or composition.

For example, the quantum dots may be configured to emit blue light, red light, or green light, and the blue light may have for example a peak emission wavelength in about 430 nm to about 480 nm, the red light may have for example a peak emission wavelength in about 600 nm to about 650 nm, and the green light may have for example a peak emission wavelength in about 510 nm to about 560 nm.

For example, a peak emission wavelength of the quantum dot layer 13 may be greater than or equal to about 300 nm, for example greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. For example, a peak emission wavelength of the quantum dot layer 13 may be less than or equal to about 700 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. For example, a peak emission wavelength of the quantum dot layer 13 may be in a range of about 500 nm to 650 nm.

For example, the quantum dot layer 13 or the quantum dots may be configured to emit green light, and a peak emission wavelength of the green light may be in a range of about 500 nm to about 560 nm or about 510 nm to about 550 nm. For example, the quantum dot layer 13 or the quantum dots may be configured to emit red light, and a peak emission wavelength of the red light may be in a range of about 600 nm to about 650 nm or about 610 nm to about 640 nm. For example, the quantum dot layer 13 or the quantum dots may be configured to emit blue light and a peak emission wavelength of the blue light may be in a range of about 440 nm to about 480 nm or about 450 nm to about 470 nm.

The quantum dots may have for example a quantum yield of greater than or equal to about 10%, greater than or equal to about 20%, greater than or equal to about 30%, greater than or equal to about 50%, greater than or equal to about 60%, greater than or equal to about 70%, or greater than or equal to about 90%.

The quantum dots may have a relatively narrow full width at half maximum (FWHM). Herein, the FWHM is a width of a wavelength corresponding to a half of a peak light emitting point, and as the FWHM is narrower, light in a narrower wavelength region may be emitted and high color purity may be obtained. The quantum dots may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

For example, the quantum dots may be for example a Group II-VI semiconductor compound, a Group III-V semiconductor compound, a Group IV-VI semiconductor compound, a Group IV semiconductor, a Group I-III-VI semiconductor compound, a Group I-II-IV-VI semiconductor compound, a Group II-III-V semiconductor compound, or a combination thereof.

The Group II-VI semiconductor compound may be for example selected from a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, but is not limited thereto.

The Group III-V semiconductor compound may be for example selected from a binary element compound selected from GaN, GaP, GaAs, GaSb, AlN, AlP, AlAs, AlSb, InN, InP, InAs, InSb and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but is not limited thereto.

The Group IV-VI semiconductor compound may be for example selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof, but is not limited thereto. The Group IV semiconductor may be for example selected from a singular element semiconductor selected from Si, Ge, and a mixture thereof; and a binary element semiconductor compound selected from SiC, SiGe, and a mixture thereof, but is not limited thereto. The Group I-III-VI semiconductor compound may be for example selected from $CuInSe_2$, $CuInS_2$, CuInGaSe, CuInGaS, and a mixture thereof, but is not limited thereto. The Group I-II-IV-VI semiconductor compound may be for example selected from CuZnSnSe and CuZnSnS, but is not limited thereto. The Group II-III-V semiconductor compound may include for example InZnP, but is not limited thereto.

The quantum dots may include the singular element semiconductor, the binary semiconductor compound, the ternary semiconductor compound, or the quaternary semiconductor compound in a substantially uniform concentration or partially different concentration distributions.

For example, the quantum dots may include Cd-free quantum dots. Cadmium (Cd) may cause severe environment/health problems and is a restricted element by Restriction of Hazardous Substances Directive (RoHS) in a plurality of countries, and thus the cadmium-free quantum dots may be effectively used. For example, the quantum dot layer 13 or the quantum dots may not include cadmium. For example, the quantum dot layer 13 or the quantum dots may not include cadmium, lead, mercury, or a combination thereof.

For example, the quantum dots may be a semiconductor compound including zinc (Zn) and at least one of tellurium (Te) and selenium (Se). For example, the quantum dots may be a Zn—Te semiconductor compound, a Zn—Se semiconductor compound, and/or a Zn—Te—Se semiconductor compound. For example, in the Zn—Te—Se semiconductor compound, an amount of tellurium (Te) may be smaller than that of selenium (Se). The semiconductor compound may have a peak emission wavelength in a wavelength region of less than or equal to about 470 nm, for example in a wavelength region of about 430 nm to about 470 nm and may be configured to emit blue light.

For example, the quantum dots may be for example a semiconductor compound including indium (In) and at least one of zinc (Zn) and phosphorus (P). For example, the quantum dots may be an In—P semiconductor compound and/or an In—Zn—P semiconductor compound. For example, in the In—Zn—P semiconductor compound, a mole ratio of zinc (Zn) relative to indium (In) may be greater than or equal to about 25.

The quantum dots may have a core-shell structure wherein one quantum dot surrounds another quantum dot. For example, the core and the shell of the quantum dot may have an interface, and an element of at least one of the core or the shell in the interface may have a concentration gradient wherein the concentration of the element(s) of the shell decreases toward the core. For example, a material composition of the shell of the quantum dot has a higher energy bandgap than a material composition of the core of the quantum dot, and thereby the quantum dot may exhibit a quantum confinement effect.

The quantum dots may have one quantum dot core and a multi-layered quantum dot shell surrounding the core. Herein, the multi-layered shell has at least two shells wherein each shell may be a single composition, an alloy, and/or the one having a concentration gradient. For example, a shell of a multi-layered shell that is far from the core may have a higher energy bandgap than a shell that is near to the core, and thereby the quantum dot may exhibit a quantum confinement effect.

For example, the quantum dots having a core-shell structure may for example include a core including a first semiconductor compound including zinc (Zn) and at least one of tellurium (Te) and selenium (Se) and a shell disposed on at least one part of the core and including a second semiconductor compound having a different composition from that of the core. For example, the first semiconductor compound may be a Zn—Te—Se-based semiconductor compound including zinc (Zn), tellurium (Te), and selenium (Se), for example a Zn—Se-based semiconductor compound including a small amount of tellurium (Te), for example, a semiconductor compound represented by $ZnTe_xSe_{1-x}$ (wherein, x is greater than about 0 and less than or equal to about 0.05). For example, in the Zn—Te—Se-based first semiconductor compound, the mole amount of zinc (Zn) may be larger than that of selenium (Se), and the mole amount of selenium (Se) may be larger than that of tellurium (Te). For example, in the first semiconductor compound, a mole ratio of tellurium (Te) relative to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1:1, less than or equal to about 0.024:1, less than or equal to about 0.023, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a mole ratio of tellurium (Te) relative to zinc (Zn) may be less than or equal to about 0.02:1, less than or equal to about 0.019:1, less than or equal to about 0.018, less than or equal to about 0.017:1, less than or equal to about 0.016:1, less than or equal to about 0.015:1, less than or equal to about 0.014:1, less than or equal to about 0.013:1, less than or equal to about 0.012, less than or equal to about 0.011:1, or less than or equal to about 0.01:1.

The second semiconductor compound may include for example a Group II-VI semiconductor compound, a Group III-V semiconductor compound, a Group IV-VI semiconductor compound, a Group IV semiconductor, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor, the Group I-III-VI semiconductor compound, the Group I-II-IV-VI semiconductor compound, and the Group II-III-V semiconductor compound are the same as described above.

For example, the second semiconductor compound may include zinc (Zn), selenium (Se), and/or sulfur (S). For example, the shell may include ZnSeS, ZnS, or a combination thereof. For example, the shell may include at least one internal shell disposed near to the core and an outermost shell disposed at the outermost of the quantum dot and the internal shell may include ZnSeS and the outermost shell may include SnS. For example, the shell may have a concentration gradient of one component and for example an amount of sulfur (S) may increase as being apart from the core.

For example, the quantum dot having a core-shell structure may include for example a core including a third semiconductor compound including indium (In) and at least one of zinc (Zn) and phosphorus (P) and a shell disposed on at least one part of the core and including a fourth semiconductor compound having a different composition from the core. In the In—Zn—P-based third semiconductor compound, a mole ratio of zinc (Zn) relative to indium (In) may be greater than or equal to about 25:1. For example, in the In—Zn—P-based third semiconductor compound, the mole ratio of zinc (Zn) relative to indium (In) may be greater than or equal to about 28:1, greater than or equal to about 29:1, or greater than or equal to about 30:1. For example, in the In—Zn—P-based third semiconductor compound, the mole ratio of zinc (Zn) relative to indium (In) may be less than or equal to about 55:1, for example less than or equal to about 50:1, less than or equal to about 45:1, less than or equal to about 40:1, less than or equal to about 35:1, less than or equal to about 34, less than or equal to about 33:1, or less than or equal to about 32:1.

The fourth semiconductor compound may include for example a Group II-VI semiconductor compound, a Group III-V semiconductor compound, a Group IV-VI semiconductor compound, a Group IV semiconductor, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor, the Group I-III-VI semiconductor compound, the Group I-II-IV-VI semiconductor compound, and the Group II-III-V semiconductor compound are the same as described above. For example, the fourth semiconductor compound may include zinc (Zn) and sulfur (S), and optionally selenium (Se). For example, the shell may include ZnSeS, ZnS, or a combination thereof. For example, the shell may include at least one internal shell disposed near to the core and an outermost shell disposed at the outermost of the quantum dot and at least one of the internal shell and the outermost shell may include the fourth semiconductor compound of ZnS or ZnSeS.

The aforementioned quantum dots may be commercially available or appropriately synthesized.

In the quantum dot device according to an embodiment, the quantum dots may include a first organic ligand on the surfaces of the quantum dots. The first organic ligand may have a hydrophobic moiety. The first organic ligand may be bound to the surfaces of the quantum dots. The first organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, wherein each R is independently a substituted or unsubstituted C3 to C40, or C5 to C40 aliphatic hydrocarbon group such as a substituted or unsubstituted C3 to C40 alkyl or alkenyl, a substituted or unsubstituted C6 to C40 aromatic hydrocarbon group such as a substituted or unsubstituted C6 to C40 aryl group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compound such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, or trioctyl amine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, diphenyl phosphine, triphenyl phosphine, or trioctyl phosphine; a phosphine oxide compound such as methyl phosphine oxide, ethyl phosphine oxide, propyl phosphine oxide, butyl phosphine oxide pentyl phosphineoxide, tributyl phosphine oxide, octyl phosphine oxide, dioctyl phosphine oxide, diphenyl phosphine oxide, triphenyl phosphine oxide, or trioctyl phosphine oxide; a C5 to C20 alkyl phosphinic acid such as hexyl phosphinic acid, octyl phosphinic acid, dodecane phosphinic acid, tetradecane phosphinic acid, hexadecane phosphinic acid, octadecane phosphinic acid; an alkylphosphonic acid such as a C5 to C20 alkylphosphonic acid, for example, hexyl phosphonic acid, octyl phosphonic acid, dodecane phosphonic acid, tetradecane phosphonic acid, hexadecane phosphonic acid, or octadecane phosphonic acid; and the like, but are not limited thereto. The quantum dots may include a hydrophobic organic ligand that is the same, or a mixture of at least two different hydrophobic organic ligands. The hydrophobic organic ligand may not include a photopolymerizable moiety (e.g., an acrylate group, a methacrylate group, etc.).

In the halogen-treated quantum dots, an amount of the halogen may be greater than or equal to about 1 microgram (ug), greater than or equal to about 1.5 ug, greater than or equal to about 3 ug, greater than or equal to about 4 ug, greater than or equal to about 5 ug, greater than or equal to about 6 ug, greater than or equal to about 7 ug, greater than or equal to about 8 ug, greater than or equal to about 9 ug, greater than or equal to about 10 ug, greater than or equal to about 11 ug, greater than or equal to about 12 ug, greater than or equal to about 12.5 ug, greater than or equal to about 13 ug, greater than or equal to about 14 ug, greater than or equal to about 15 ug, greater than or equal to about 16 ug, greater than or equal to about 17 ug, greater than or equal to about 18 ug, or greater than or equal to about 19 ug and/or less than about 30 ug, less than or equal to about 25 ug, less than or equal to about 20 ug, less than or equal to about 19.5 ug, less than or equal to about 19 ug, less than or equal to about 18 ug, less than or equal to about 17 ug, less than or equal to about 15 ug, less than or equal to about 12.5 ug, or less than or equal to about 12 ug, per 1 milligram (mg) of the quantum dots, e.g., as confirmed by an ion chromatography. The halogen may be chlorine.

The halogen treated quantum dots may be prepared by a method that includes:

obtaining an organic dispersion including a plurality of quantum dots including first organic ligands on the surfaces of the quantum dots and a first organic solvent; obtaining a halide (e.g., chloride) solution including a polar organic solvent compatible with the first organic solvent and a metal halide; and adding the halide solution to the organic dispersion so that a content of the metal halide based on a total weight of the quantum dots may be greater than or equal to about 0.1 weight percent (wt %) and less than or equal to about 10 wt %, and stirring the resulting solution at a temperature of greater than or equal to about 45° C., for example, greater than or equal to about 50° C., greater than or equal to about 55° C., or greater than or equal to about 60° C. and less than or equal to about 150° C., less than or equal to about 140° C., less than or equal to about 100° C., less than or equal to about 90° C., less than or equal to about 80° C., or less than or equal to about 70° C., wherein a volume ratio of the polar organic solvent relative to the first organic solvent is less than or equal to about 0.1:1. A volume ratio of the polar organic solvent relative to the first organic solvent may be less than or equal to about 0.05:1. A volume ratio of the polar organic solvent relative to the first organic solvent may be greater than or equal to about 0.001:1, greater than or equal to about 0.005:1, or greater than or equal to about 0.01:1.

The metal halide (e.g., chloride) includes zinc halide, indium halide, gallium halide, magnesium halide, lithium halide, or a combination thereof. The first organic solvent may include a substituted or unsubstituted C5 to C40 aliphatic hydrocarbon, a substituted or unsubstituted C6 to C40 aromatic hydrocarbon, a substituted or unsubstituted C3 to C40 alicyclic hydrocarbon, or a combination thereof. The polar organic solvent may include a C1 to C10 alcohol, or a combination thereof.

The quantum dot layer 13 may have for example a thickness of about 5 nm to about 200 nm, for example about 10 nm to about 150 nm, about 20 nm to about 100 nm, or about 30 nm to about 50 nm. For example, the quantum dot layer 13 may include one or more monolayers of quantum dots. For example, the quantum dot layer 13 may include at least 1 monolayer of the quantum dots, at least two monolayers of the quantum dots, at least three monolayers of the quantum dots or at least four monolayers of the quantum dots, and less than or equal to ten monolayers of the quantum dots, less than or equal to nine monolayers of the quantum dots, less than or equal to eight monolayers of the quantum dots, less than or equal to seven monolayers of the quantum dots, less than or equal to six monolayers of the quantum dots.

The quantum dot layer 13 may include a single layered structure or a multi-layered structure. An adjacent quantum dot layer of a multi-layered structure may have different properties and/or composition that the other layer. For example, the quantum dot layer 13 may include a first layer and a second layer adjacent to each other. For example, the first layer and the second layer may include the halogen-treated quantum dots. For example, the quantum dot layer 13 may include a first layer, a second layer, and a third layer sequentially stacked. For example, the first layer and the second layer may include the halogen-treated quantum dots and the third layer may include the quantum dots having the organic ligands.

For example, the quantum dot layer 13 may include halogen (e.g. chlorine). A concentration of halogen in the quantum dot layer 13 may vary according to a thickness direction of the quantum dot layer 13. For example the concentration of halogen in the quantum dot layer 13 may increase in a direction toward the electron auxiliary layer 15, or for example, the concentration of halogen in the quantum dot layer 13 may decrease in a direction toward the electron auxiliary layer 15.

For example, a concentration of carbon in the quantum dot layer 13 may vary according to a thickness direction of the quantum dot layer 13, for example the concentration of carbon in the quantum dot layer 13 may increase in a direction toward the electron auxiliary layer 15, or for example, the concentration of carbon in the quantum dot layer 13 may decrease in a direction toward the electron auxiliary layer 15.

For example, the quantum dot layer 13 may include a first quantum dot layer including the halogen treated quantum dots, a second quantum dot layer including the halogen treated quantum dots, and optionally a third quantum dot layer including quantum dots having organic ligands on the surfaces of the quantum dots. The second quantum dot layer may be positioned between the first quantum dot layer and the third quantum dot layer.

The quantum dot layer 13 may have a relatively deep HOMO energy level and may have for example a HOMO energy level of greater than or equal to about 5.4 electron Volts (eV), greater than or equal to about 5.6 eV, greater than or equal to about 5.7 eV, greater than or equal to about 5.8 eV, greater than or equal to about 5.9 eV, or greater than or equal to about 6.0 eV. The HOMO energy level of the quantum dot layer 13 may be for example about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV, within the ranges, for example about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, or about 5.6 eV to about 6.1 eV, for example about 5.7 eV to about 7.0 eV, about 5.7 eV to about 6.8 eV, about 5.7 eV to about 6.7 eV, about 5.7 eV to about 6.5 eV, about 5.7 eV to about 6.3 eV, about 5.7 eV to about 6.2 eV, or about 5.7 eV to about 6.1 eV, for example about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, for example about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, or about 6.0 eV to about 6.2 eV.

The quantum dot layer 13 may have a relatively shallow LUMO energy level and may have for example an LUMO energy level of less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The LUMO energy level of the quantum dot layer 13 may be for example about 2.5 eV to about 3.6 eV, about 2.5 eV to about 3.5 eV, about 2.5 eV to about 3.4 eV, about 2.5 eV to about 3.3 eV, about 2.5 eV to 3.2 eV, about 2.5 eV to about 3.1 eV, about 2.5 eV to about 3.0 eV, about 2.8 eV to about 3.6 eV, about 2.8 eV to about 3.5 eV, about 2.8 eV to about 3.4 eV, about 2.8 eV to about 3.3 eV, about 2.8 eV to about 3.2 eV, about 3.0 eV to about 3.6 eV, about 3.0 eV to about 3.5 eV, or about 3.0 eV to about 3.4 eV.

The quantum dot layer 13 may have an energy bandgap of about 2.4 eV to about 2.9 eV. Within the ranges, it may have for example an energy bandgap of about 2.4 eV to about 2.8 eV, for example about 2.4 eV to about 2.78 eV.

The hole auxiliary layer 14 is disposed between the first electrode 11 and the quantum dot layer 13.

The hole auxiliary layer 14 may have one layer or two or more layers and may include a hole transport layer, a hole injection layer, an electron blocking layer, and/or other auxiliary layers. The hole auxiliary layer 14 may have a relatively deep HOMO energy level so that it may match the HOMO energy level of the quantum dot layer 13. Accordingly, the mobility of holes from the hole auxiliary layer 14 into the quantum dot layer 13 may be increased.

The hole auxiliary layer 14 may have the same HOMO energy level as the quantum dot layer 13 or a smaller HOMO energy level than the quantum dot layer 13 within about 1.0 eV or less. For example, a difference between HOMO energy levels of the hole auxiliary layer 14 and the quantum dot layer 13 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The hole auxiliary layer 14 may have a HOMO energy level of for example greater than or equal to about 5.0 eV, greater than or equal to about 5.2 eV, greater than or equal to about 5.4 eV, greater than or equal to about 5.6 eV, or greater than or equal to about 5.8 eV.

For example, the hole auxiliary layer 14 may have a HOMO energy level of about 5.0 eV to about 7.0 eV, about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

The hole auxiliary layer 14 may include any material satisfying the energy level without a particularly limit and may be for example at least one of poly(9,9-dioctyl-fluorene-co-N-(4-butylphenyl)-diphenylamine)(TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-tris[phenyl(m-tolyl)amino] triphenylamine), 4,4',4"-tris(N-carbazolyl)-triphenylamine (TCTA), 1,1-bis[(di-4-tolylamino)phenyl]cyclohexane (TAPC), p-type metal oxide (e.g., NiO, $WO_3$, $MoO_3$, etc.), a carbon-based material such as graphene oxide, and a combination thereof, but is not limited thereto.

The electron auxiliary layer 15 is disposed between the second electrode 12 and the quantum dot layer 13. The electron auxiliary layer 15 may have one layer or two or more layers and may include an electron transport layer, an electron injection layer, a hole blocking layer, and/or other auxiliary layers. For example, the electron auxiliary layer 15 may be in contact with the second electrode 12.

For example, the electron auxiliary layer 15 may be in contact with the quantum dot layer 13. For example, the electron auxiliary layer 15 may be an electron transport layer, and the quantum dot device 100 does not include an electron injection layer.

For example, one surface of the electron auxiliary layer 15 may be in contact with the second electrode 12 and the other surface of the electron auxiliary layer 15 may be in contact with the quantum dot layer 13.

The electron auxiliary layer 15 may facilitate injection of electrons from the second electrode 12, and effectively transfer the injected electrons to the quantum dot layer 13.

The electron auxiliary layer 15 may include inorganic nanoparticles. The inorganic nanoparticles may be a main component of the electron auxiliary layer 15. The inorganic nanoparticles may be, for example, oxide nanoparticles, for example, metal oxide nanoparticles. For example, the inorganic nanoparticles may be metal oxide nanoparticles including two or more different metals. For example, the inorganic nanoparticles may be inorganic semiconductors. For example, the inorganic nanoparticles may be a mixture of two or more types of metal oxide nanoparticles.

The inorganic nanoparticles may be two-dimensional or three-dimensional nanoparticles with an average particle diameter of less than or equal to about 10 nm, within the range, less than or equal to about 8 nm, less than or equal to about 7 nm, less than or equal to about 5 nm, less than or equal to about 4 nm, or less than or equal to about 3.5 nm, or within the range, about 1 nm to about 10 nm, about 1 nm to about 9 nm, about 1 nm to about 8 nm, about 1 nm to about 7 nm, about 1 nm to about 5 nm, about 1 nm to about 4 nm, or about 1 nm to about 3.5 nm.

The HOMO energy level of the inorganic nanoparticles may be, for example, deeper than the HOMO energy level of the quantum dot layer 13. For example, the HOMO energy level of the inorganic nanoparticles may be about 0.2 eV or more, about 0.5 eV or more, about 0.8 eV or more, about 1.0 eV or more, about 1.2 eV or more, or about 1.5 eV or more, for example about 0.2 eV to about 3.0 eV, about 0.5 eV to about 3.0 eV, about 0.8 eV to about 3.0 eV, about 1.0 eV to about 3.0 eV, about 1.2 eV to about 3.0 eV or about 1.5 eV to about 3.0 eV deeper than the HOMO energy level of the quantum dot layer 13.

For example, the inorganic nanoparticles may have a relatively deep HOMO energy level. The HOMO energy level of the inorganic nanoparticles may be for example about 5.6 eV to about 8.5 eV, within the range about 5.8 eV to about 8.2 eV, about 6.0 eV to about 8.0 eV, about 6.2 eV to about 8.0 eV, about 6.5 eV to about 8.0 eV, about 6.8 eV to about 8.0 eV, about 7.0 eV to about 8.0 eV, about 7.2 eV to about 7.9 eV, or about 7.3 eV to about 7.8 eV.

The inorganic nanoparticles have a relatively deep HOMO energy level, thereby effectively blocking holes and improving stability of the quantum dot device.

The LUMO energy level of the inorganic nanoparticles may be about 2.5 to 3.4 eV, about 2.6 to about 3.3 eV or about 2.7 eV to about 3.2 eV.

The inorganic nanoparticles may be selected from materials satisfying the aforementioned energy levels. For example, the inorganic nanoparticles may be metal oxide nanoparticles including alkaline-earth metals.

For example, the inorganic nanoparticles may be metal oxide nanoparticles including beryllium (Be), magnesium (Mg), calcium (Ca), barium (Ba), strontium (Sr), radium (Ra), or a combination thereof. The inorganic nanoparticles may be metal oxide nanoparticles including at least one of zinc (Zn), cobalt (Co), nickel (Ni), gallium (Ga), zirconium (Zr), tungsten (W), titanium (Ti), tantalum (Ta), tin (Sn), and hafnium (Hf), in addition to the alkaline-earth metals.

For example, the inorganic nanoparticles may be metal oxide nanoparticles including alkaline-earth metal and zinc (Zn), wherein the alkaline-earth metal may be included in an amount that is less than an amount of zinc. For example, the alkaline-earth metal may be included in an amount of about 0.01 atomic percent (at %) to about 30 at % or about 0.01 at % to about 20 at % based on the total number of metal atoms included in the inorganic nanoparticles, that is, the total number of alkaline-earth metals and zinc. For example, the inorganic nanoparticles may be represented by $Zn_{1-x}Q_xO$ (Q is Be, Mg, Ca, Ba, Sr, Ra, or a combination thereof, and $0<x<0.5$). For example, Q may include Mg, and for example, $0.01 \leq x \leq 0.3$ or $0.01 \leq x \leq 0.2$.

The electron auxiliary layer 15 may include an alkali metal, an alkali metal compound, or a combination thereof, in a form of a mixture with the aforementioned inorganic nanoparticles, and may be included in the electron auxiliary layer 15 in a limited amount to improve electron transport properties and/or electron injection properties of the electron auxiliary layer 15.

As an example, the presence of alkali metal, an alkali metal compound, or a combination thereof, as a mixture with the inorganic nanoparticles may change the work function (Fermi energy) of the electron auxiliary layer 15 while substantially maintaining the relatively deep HOMO energy level of the aforementioned inorganic nanoparticles.

For example, the work function of a mixture of the inorganic nanoparticles and the alkali metal, an alkali metal compound, or a combination thereof, (hereinafter referred to as a "mixture") may be shallower than the work function of the inorganic nanoparticles alone. For example, the work function of the mixture may be shallower than the work function of the inorganic nanoparticles alone by greater than 0 eV and less than about 0.7 eV, about 0.01 eV to about 0.7 eV, about 0.01 eV to about 0.6 eV, about 0.01 eV to about 0.5 eV, or about 0.01 eV to about 0.4 eV.

The alkali metal may include a metal cation of the alkali metal, an alkali metal compound, or a combination thereof. The alkali metal may include, for example, lithium (Li), sodium (Na), potassium (K), cesium (Cs), rubidium (Rb), francium (Fr), or a combination thereof. The alkali metal compound may be a compound (including a salt) including the alkali metal. For example, the alkali metal compound may include an anion such as carbonate ($CO_3^{2-}$), phosphate ($PO_4^{3-}$), vanadate ($VO_4^{3-}$), azide ($N_3^-$), or nitride ($N^{3-}$). The alkali metal compound may be derived from a compound (including a salt) including the alkali metal. For example, the alkali metal compound may be derived from an alkali carbonate, alkali phosphate, alkali vanadate, alkali azide, or alkali nitride.

For example, the alkali metal such as lithium (Li), sodium (Na), potassium (K), cesium (Cs), rubidium (Rb), francium (Fr), or a combination thereof, or the alkali metal compound such as cesium carbonate ($Cs_2CO_3$), cesium phosphate ($Cs_3PO_4$), cesium vanadate ($Cs_3VO_4$), cesium azide ($CsN_3$), lithium carbonate ($Li_2CO_3$), lithium nitride ($Li_3N$), sodium carbonate ($Na_2CO_3$), potassium carbonate ($K_2CO_3$), rubidium carbonate ($Rb_2CO_3$), or a combination thereof, but is not limited thereto.

In the mixture, total alkali metal may be included in an amount less than the inorganic nanoparticles. For example, the total alkali metal may be included in an amount of about 0.1 volume % to 30 volume % based on a total volume of the mixture, and within the range of about 0.1 volume % to about 25 volume %, about 0.1 volume % to about 20 volume %, about 0.5 volume % to about 18 volume %, about 1 volume % to about 15 volume %, or about 3 volume % to about 15 volume %.

For example, total alkali metal in the electron auxiliary layer may be included in an amount of greater than 0 at % and less than about 0.5 at %, based on the total number of atoms in the electron auxiliary layer 15. Within the range, the total alkali metal may be included in an amount of greater than 0 at % and less than or equal to about 0.45 at %, greater than 0 at % and less than or equal to about 0.40 at %, greater than 0 at % and less than or equal to about 0.35 at %, greater than 0 at %, and less than or equal to about 0.30 at %, greater than 0 at % and less than or equal to about 0.25 at %, greater than 0 at % and less than or equal to about 0.20 at %, greater than or equal to about 0.01 at % and less than about 0.50 at %, about 0.01 at % to about 0.45 at %, about 0.01 at % to about 0.40 at %, about 0.01 at % to about 0.35 at %, about 0.01 at % to about 0.30 at %, about 0.01 at % to about 0.25 at %, about 0.01 at % to about 0.20 at %, about 0.01 at % to about 0.18 at %, about 0.01 at % to about 0.15 at %, greater than or equal to about 0.02 at % and less than about 0.50 at %, about 0.02 at % to about 0.45 at %, about 0.02 at % to about 0.40 at %, about 0.02 at % to about 0.35 at %, about 0.02 at % to about 0.30 at %, about 0.02 at % to about 0.25 at %, about 0.02 at % to about 0.20 at %, about 0.02 at % to about 0.18 at %, about 0.02 at % to about 0.15 at %, greater than or equal to about 0.03 at % and less than about 0.50 at %, about 0.03 at % to about 0.45 at %, about 0.03 at % to about 0.40 at %, about 0.03 at % to about 0.35 at %, about 0.03 at % to about 0.30 at %, about 0.03 at % to about 0.25 at %, about 0.03 at % to about 0.20 at %, about 0.03 at % to about 0.18 at %, about 0.03 at % to about 0.15 at %, greater than or equal to about 0.05 at % and less than about 0.50 at %, about 0.05 at % to about 0.45 at %, about 0.05 at % to about 0.40 at %, about 0.05 at % to about 0.35 at %, about 0.05 at % to about 0.30 at %, about 0.05 at % to about 0.25 at %, about 0.05 at % to about 0.20 at %, about 0.05 at % to about 0.18 at %, or about 0.05 at % to about 0.15 at %.

The total alkali metal is included in the above range to effectively improve electron transport properties and/or electron injection properties, thereby improving a performance of the quantum dot device 10.

For example, when the electron auxiliary layer 15 is analyzed by X-ray photoelectron spectroscopy (XPS), a constitution ratio (a mole ratio) of the alkaline-earth metal, which is present in the inorganic nanoparticles may be greater than a constitution ratio (a mole ratio) of total alkali metal, e.g., the alkali metal, alkali metal of the alkali metal compound, or a combination thereof.

For example, the constitution ratio (a mole ratio) of the alkaline-earth metal included in the electron auxiliary layer 15 may be about 1.01 times to 50 times, about 1.05 times to 40 times, or about 1.1 times to 40 times greater than that of the alkali metal, alkali metal of the alkali metal compound, or a combination thereof.

In the electron auxiliary layer 15, a mole ratio of the alkaline-earth metal relative to the alkali metal may be greater than about 1:1, for example greater than or equal to about 1.01:1, greater than or equal to about 1.1:1, greater than or equal to about 1.15:1, greater than or equal to about 1.2:1, greater than or equal to about 1.25:1, greater than or equal to about 1.3:1, greater than or equal to about 1.35:1, greater than or equal to about 1.40:1, greater than or equal to about 1.45:1, greater than or equal to about 1.50:1, greater than or equal to about 1.55:1, greater than or equal to about 1.60:1, greater than or equal to about 1.65:1, greater than or equal to about 1.70:1, greater than or equal to about 1.75:1, greater than or equal to about 1.80:1, greater than or equal to about 1.85:1, greater than or equal to about 1.90:1, greater than or equal to about 1.95:1, greater than or equal to about 2:1, greater than or equal to about 2.1:1, greater than or equal to about 2.2:1:1, greater than or equal to about 2.3:1, greater than or equal to about 2.4:1, or greater than or equal to about 2.5:1. In the electron auxiliary layer 15, a mole ratio of the alkaline-earth metal relative to the alkali metal may be less than or equal to about 50:1, less than or equal to about 40:1, less than or equal to about 30:1, less than or equal to about 20:1, less than or equal to about 10:1, less than or equal to about 7:1, less than or equal to about 5:1, less than or equal to about 4:1, less than or equal to about 3:1, or less than or equal to about 2.5:1.

The thickness of the electron auxiliary layer 15 may be greater than or equal to about 5 nm, greater than or equal to about 10 nm, less than or equal to about 80 nm, less than or equal to about 60 nm, about 5 nm to about 60 nm, about 5 nm to about 80 nm, about 5 nm to about 50 nm, or about 10 nm to about 40 nm.

The quantum dot device 10 may have one or more of improved stability, hole blocking properties, and electron transport/injection properties, and thus, exhibits an improvement in device performance. The improvement in-part is the result of including a mixture of the inorganic nanoparticles having a relatively deep HOMO energy level and the alkali metal, alkali metal compound, or a combination thereof, the latter capable of improving electron transport properties and/or electron injection properties, with a limited amount, as described above, in the electron auxiliary layer 15.

In general, electron transport properties and stability/hole blocking properties in an electron auxiliary layer between an electrode and a quantum dot layer are recognized and understood in the art to be a trade-off relationship. In other words, in order to increase or enhance the electron transport properties of the electron auxiliary layer 15, the energy band gap of the electron auxiliary layer 15 should be smaller. In contrast, in order to increase the stability and the hole blocking property of the electron auxiliary layer 15, the energy band gap of the electron auxiliary layer 15 should be larger. In the quantum dot device 10 according to the present embodiment, the electron auxiliary layer 15 includes an alkaline-earth metal (e.g., as a component of an inorganic particle), and thus the energy band gap is increased to enhance stability and hole blocking properties. Although in the present embodiment, the reduced electron transport properties due to the increased energy band gap may be compensated by lowering the work function (Fermi energy) with the alkali metal, alkali metal compound, or a combination thereof, thereby increasing a generation of free electrons.

Accordingly, the electron auxiliary layer 15 may effectively improve the electrical and optical properties of the quantum dot device 10 by simultaneously satisfying both the electron transport properties and stability/hole blocking properties of an electron auxiliary layer.

Such improved electrical and optical properties may be defined as "Transport layer optimum factor (TLOF)." The TLOF is an equation to express a degree of satisfying the electron transport properties and the stability/hole blocking property, which for the reason described, tend to exist as a trade-off relationship.

For example, the TLOF may be represented by Equation 1.

$$\text{TLOF} = \log(\text{majority carrier transport/minority carrier leakage}) \quad \text{Equation 1}$$

In the Equation 1, the majority carrier transport is an amount of one of electrons and holes per unit area transporting through the electron auxiliary layer, and the minority carrier leakage is an amount of the other of electrons and holes per unit area leaking through the electron auxiliary layer.

For example, when an electron transport path is from the second electrode 12 to the quantum dot layer 13 via the electron auxiliary layer 15, the majority carrier transport is an amount of electrons per unit area transporting through the electron auxiliary layer 15, and the minority carrier leakage is an amount of holes per unit area that pass or leak through the electron auxiliary layer 15.

For example, the TLOF may be represented by Equation 1A.

$$\text{TLOF} = \log(ET/HL)$$

In the Equation 1A,

ET is an amount of electrons per unit area of square centimeters ($cm^2$) transporting through the electron auxiliary layer, and HL is an amount of holes per unit area of square meters ($m^2$) that pass or leak through the electron auxiliary layer.

The TLOF may be evaluated using electron-only device (EOD). The EOD is a sample device to evaluate electron transport properties and hole blocking properties of the electron auxiliary layer 15, and includes the first electrode 11; the second electrode 12; the quantum dot layer 13 disposed between the first electrode 11 and the second electrode 12; and electron auxiliary layers 15 disposed between the first electrode 11 and the quantum dot layer 13 and disposed between the second electrode 12 and the quantum dot layer 13, respectively. The electron auxiliary layers 15 disposed between the second electrode 12 and the quantum dot layer 13 is to evaluate transport properties of electrons transporting from the second electrode 12 to the quantum dot layer 13, and the electron auxiliary layers 15 disposed between the first electrode 11 and the quantum dot layer 13 is to evaluate blocking properties of holes leaking from the first electrode 11 to the quantum dot layer 13. The amount of electrons per unit area ($cm^2$) transporting through the electron auxiliary layer 15 may be evaluated by electrical properties of electrons transport from the second electrode 12 to the quantum dot layer 13 via the electron auxiliary layer 15, namely current density of the EOD. The amount of holes per unit area (m$^2$) leaking through the electron auxiliary layer may be evaluated by luminance of the EOD, as the higher the luminance means the higher the hole leakage, in consideration of emitting light in proportion to the number of holes reaching the quantum dot layer 13 through the electron auxiliary layer 15 from the first electrode 11. In other words, in the Equation 1A, the higher the amount of electrons per unit area (cm$^2$) transporting through the electron auxiliary layer (higher current density), the higher TLOF, and the higher an amount of holes per unit area (m$^2$) leaking through the electron auxiliary layer 15 (higher luminance), the lower the TLOF. Namely, in the Equation 1A, the TLOF is higher, as current density of the EOD is higher and luminance of the EOD is lower.

The electron auxiliary layer 15 in the quantum dot device 10 according to the present embodiment may satisfy the TLOF in a predetermined value or more by including an electron auxiliary layer 15 that simultaneously satisfies electron transport properties and stability/hole blocking properties, which are on a trade-off relationship, as described above.

For example, the electron auxiliary layer 15 of the quantum dot device 10 may satisfy Equation 1A-1:

$$\log(ET/HL) \geq 5.50 \quad \text{Equation 1A-1}$$

For example, the electron auxiliary layer 15 of the quantum dot device 10 may satisfy Equation 1A-2:

$$\log(ET/HL) \geq 5.70 \quad \text{Equation 1A-2}$$

For example, the electron auxiliary layer 15 of the quantum dot device 10 may satisfy Equation 1A-3:

$$\log(ET/HL) \geq 5.90 \quad \text{Equation 1A-3}$$

For example, the electron auxiliary layer 15 of the quantum dot device 10 may satisfy Equation 1A-4:

$$\log(ET/HL) \geq 6.10 \quad \text{Equation 1A-4}$$

The TLOF may be less than or equal to about 30, and thus Equation 1A-1, 1A-2, 1A-3, and 1A-4 are represented by Equation 1A-1', 1A-2', 1A-3', and 1A-4', respectively.

$$5.50 \leq \log(ET/HL) \leq 30.0 \quad \text{Equation 1A-1'}$$

$$5.70 \leq \log(ET/HL) \leq 30.0 \quad \text{Equation 1A-2'}$$

$$5.90 \leq \log(ET/HL) \leq 30.0 \quad \text{Equation 1A-3'}$$

$$6.10 \leq \log(ET/HL) \leq 30.0 \quad \text{Equation 1A-4'}$$

The electron auxiliary layer 15 may improve the performance of the quantum dot device 10 by improving one or more of stability, hole blocking properties, and electron transport properties.

A method of manufacturing the quantum dot device 10 includes forming a first electrode 11 on a substrate (not shown), forming a hole auxiliary layer 14, forming a quantum dot layer 13, forming the electron auxiliary layer 15, and forming the second electrode 12.

The quantum dot layer 13, the hole auxiliary layer 14, and/or the electron auxiliary layer 15 may be formed by a solution process, such as spin coating, slit coating, inkjet printing, nozzle printing, spraying, and/or doctor blade coating, but is not limited thereto.

At least some portions of each process of forming the quantum dot layer 13, the hole auxiliary layer 14, and/or the electron auxiliary layer 15 may further include optionally drying and/or heat treating the resultant after the solution process, and heat-treating may be performed, for example, in a range of about 1 minute to 10 hours at about 50° C. to about 300° C., but are not limited thereto.

For example, the forming of the electron auxiliary layer 15 may include dispersing inorganic nanoparticles in a first organic solvent to prepare an inorganic nanoparticle dispersion, preparing a solution including the alkali metal, an alkali metal compound, or a combination thereof, mixing the inorganic nanoparticle dispersion and the solution to prepare a coating dispersion, applying the coating dispersion (for example, on the quantum dot layer 13), and optionally drying and/or heat-treating the dispersions.

The inorganic nanoparticles may be obtained by a sol-gel synthesis method using a metal salt, but are not limited thereto.

A dispersion medium for the inorganic nanoparticle dispersion may be, for example, water; alcohols such as methanol, ethanol, propanol or butanol; or a combination water and alcohol, but is not limited thereto.

A solvent for the alkali metal/compound solution may be, for example, water; alcohols such as methanol, ethanol, propanol or butanol; or a combination thereof, but is not limited thereto. The concentration of the alkali metal/compound in the solution may be less than or equal to about 1 milligrams per milliliter (mg/mL), less than or equal to about 0.9 mg/mL, less than or equal to about 0.8 mg/mL, less than or equal to about 0.7 mg/mL, less than or equal to about 0.6 mg/mL, less than or equal to about 0.5 mg/mL, less than or equal to about 0.4 mg/mL, or less than or equal to about 0.3 mg/mL. The concentration of the alkali metal/compound in the solution may be greater than or equal to about 0.00001 mg/mL, greater than or equal to about 0.00005 mg/mL, or greater than or equal to about 0.0001 mg/mL.

In the coating dispersions, a mixing ratio of the inorganic nanoparticles and the alkali metal/compound solution may be controlled to obtain a desired composition of the electron auxiliary layer 15.

The quantum dot device 10 may exhibit improved electrical and optical properties and life-span properties. For example, the quantum dot device 10 may be configured to emit light in a predetermined wavelength region, for example, red light, green light, or blue light. An emission spectrum of the quantum dot device 10 configured to emit red light has a maximum emission wavelength in about 600 nm to about 650 nm. An emission spectrum of the quantum dot device 10 configured to emit green light has a maximum emission wavelength in about 500 nm to about 560 nm. An emission spectrum of the quantum dot device 10 configured to emit blue light has a maximum emission wavelength in about 440 nm to about 480 nm.

For example, a maximum external quantum efficiency (EQE) of the quantum dot device 10 may be greater than about 5%, greater than about 10%, greater than about 11% or greater than about 12%. A maximum luminance of the quantum dot device 10 may be greater than or equal to about 50,000 cd/m$^2$, greater than or equal to about 55,000 cd/m$^2$, greater than or equal to about 60,000 cd/m$^2$, greater than or equal to about 65,000 cd/m$^2$, greater than or equal to about 70,000 cd/m$^2$, greater than or equal to about 75,000 cd/m$^2$, greater than or equal to about 80,000 cd/m$^2$, greater than or equal to about 85,000 cd/m$^2$, greater than or equal to about 90,000 cd/m$^2$, greater than or equal to about 95,000 cd/m$^2$, or greater than or equal to about 100,000 cd/m$^2$.

For example, T50 of the quantum dot device 10 may be greater than or equal to about 50 hours, greater than or equal to about 55 hours, greater than or equal to about 60 hours, or greater than or equal to about 65 hours.

The aforementioned quantum dot device may be applied to various electronic devices that require light emission, and may be applied to various electronic devices such as display devices, for example, TVs, monitors, computers, mobile devices, and lighting devices, for example light sources.

Hereinafter, the embodiments are illustrated in more detail with reference to examples. However, these examples are exemplary, and the present scope is not limited thereto.

Synthesis of Quantum Dot Dispersion

Synthesis Example 1: Synthesis 1 of Blue Light Emitting Quantum Dot (1) Synthesis of ZnTeSe Core Quantum Dot Dispersion Selenium (Se) and tellurium (Te) are dispersed in trioctylphosphine (TOP) to obtain a 2 M Se/TOP stock solution and a 0.1 M Te/TOP stock solution. To 10 mL of trioctylamine in a reactor 0.125 mmol of zinc acetate, 0.25 mmol of oleic acid, and 0.25 mmol of hexadecylamine are added, and the mixture is heated at 120° C. under vacuum. After 1 hour, nitrogen ($N_2$) is added to the reactor, and the temperature of the reactor is raised to 240° C., the Se/TOP stock solution and the Te/TOP stock solution are rapidly added to the reactor in a Te:Se mole ratio of 1:25. After the temperature of the reactor is raised to 300° C., and the temperature is maintained for 30 minutes, the reaction mixture is rapidly cooled down to room temperature. Acetone is added to the reaction mixture, and the resulting precipitate is separated with a centrifuge, The precipitate is dispersed in toluene to obtain ZnTeSe core quantum dot dispersion in toluene.

(2) Synthesis of ZnTeSe Core/ZnSeS Shell Quantum Dot Dispersion

Trioctylamine 0.6 mmol of zinc acetate and 1.2 mmol of oleic acid are added to a 10 mL flask. The mixture is vacuum-treated at 120° C. for 10 minutes, after which nitrogen is introduced into the flask. The ZnTeSe core quantum dot dispersion is rapidly injected into the flask, followed by the addition of 2 M Se/TOP and 1M S/TOP to provide a Se:S mole ratio of 1.2:2.8. The flask is heated to 340° C. When the reaction is complete, the reactor is cooled down, and the resulting nanocrystals are separated with a centrifuge, washed with ethanol, and dispersed in toluene to obtain ZnTeSe core/ZnSeS shell quantum dot dispersion in toluene.

Synthesis Example 2: Synthesis 2 of Blue Light Emitting Quantum Dot

Zinc chloride is dissolved in ethanol to obtain a zinc chloride solution with a concentration of 10 weight percent (wt %). The zinc chloride solution (0.01 mL) is added to the ZnTeSe core/ZnSeS shell quantum dot dispersion obtained in Synthesis Example 1 and the mixture stirred at 60° C. for 30 minutes to perform a surface exchange reaction. After the exchange reaction, ethanol is added to induce precipitation, and the resulting precipitate is separated with a centrifuge and dispersed in chloroform or toluene. The process of Synthesis Example 2 is repeated several times to obtain halogen-treated ZnTeSe core/ZnSeS shell quantum dot dispersions.

Synthesis Example 3: Synthesis of Red Light Emitting Quantum Dot (1) Synthesis of InP Core Quantum Dot Dispersion Indium acetate and palmitic acid are dissolved in 1-octadecene in a 200 mL reaction flask and heated at 120° C. under vacuum. The indium and palmitic acid are used in a mole ratio of 1:3, respectively. After 1 hour, nitrogen is introduced into the reactor, and the temperature of the reactor is raised to 280° C. A mixed solution of tris(trimethylsilyl)phosphine ($TMS_3P$) and trioctylphosphine is rapidly added to the flask and allowed to react for 20 minutes, and then the reaction mixture is cooled down to room temperature. The added amount of $TMS_3P$ is 0.5 mole based on 1 mole of indium. Acetone is added to the reaction flask and the resulting precipitate is separated with a centrifuge and then dispersed in toluene to prepare an InP core quantum dot dispersion. The obtained InP core quantum dot has a particle diameter of about 3 nanometers (nm).

(2) Synthesis of InP Core/ZnSe Shell/ZnS Shell Quantum Dot Dispersion

Selenium (Se) is dispersed in trioctylphosphine (TOP) to prepare a Se/TOP stock solution, and sulfur (S) is dispersed in trioctylphosphine (TOP) to prepare an S/TOP stock solution. To a 200 mL reaction flask containing trioctylamine, zinc acetate and oleic acid are added, and the reaction flask is vacuum-treated at 120° C. for 10 minutes. Subsequently, nitrogen is introduced into the reaction flask, the flask is heated to 180° C., and the InP core quantum dot dispersion is added to the flask. The mixture is heated to 280° C., a first portion of the Se/TOP solution is injected into the flask, and the temperature of the flask is raised to 320° C. A second portion of the remaining Se/TOP solution is injected into the flask, and the reaction is allowed to proceed for a predetermined time to form a ZnSe shell on the InP core. Thereafter, the S/TOP stock solution is injected into the reaction mixture and the reaction is allowed to proceed for a predetermined time to form a ZnS shell on the ZnSe shell to obtain an InP core/ZnSe shell/ZnS shell quantum dot. A total reaction time for forming the ZnSe shell is about 60 minutes, a total amount of Se is about 20 moles based on 1 mole of indium, a total reaction time for forming the ZnS shell is about 60 minutes, and a total amount of S is about 10 moles based on 1 mole of indium.

An excessive amount of ethanol is added to the reaction flask to complete precipitation of the InP core/ZnSe shell/ZnS shell quantum dot. The precipitate is separated with a centrifuge, dried, and dispersed in chloroform or toluene to obtain InP core/ZnSe shell/ZnS shell quantum dot dispersion.

Synthesis of Inorganic Nanoparticle

Synthesis Example 4

0.93 millimoles (mmol) of magnesium acetate tetrahydrate, 8.07 mmol of zinc acetate dihydrate, and 90 mL of dimethylsulfoxide are added to a reactor and heated under air at 60° C. 15 mmol of tetramethylammonium hydroxide pentahydrate is dissolved in 30 mL of ethanol, and the solution is added slowly to the reactor at 3 mL per minute in a dropwise fashion. Following the complete addition of the hydroxide the reaction mixture is stirred for 1 hour. The prepared $Zn_{0.85}Mg_{0.15}O$ nanoparticles and ethyl acetate are centrifuged in a volume ratio of 1:9 and dispersed in ethanol with a concentration of 1 wt % to obtain a $Zn_{0.85}Mg_{0.15}O$ nanoparticle dispersion. The average particle diameter of $Zn_{0.85}Mg_{0.15}O$ nanoparticles measured with UT F30 Tecnai electron microscope is about 3.0 nm.

Comparative Synthesis Example 1

9.00 mmol of zinc acetate dihydrate and 90 mL of dimethylsulfoxide are added a reactor and the mixture is heated at 60° C. under air. A hydroxide solution of 15 mmol of tetramethylammonium hydroxide pentahydrate in 30 mL of ethanol is prepared, and the hydroxide solution is slowly added as above (i.e., dropwise, 3 mL per minute) to the reactor. After stirring the reaction mixture for 1 hour, the obtained ZnO nanoparticles are separated with a centrifuge with ethyl acetate in a volume ratio of 1:9, and then, dispersed in ethanol with a concentration of 1 wt % to obtain ZnO nanoparticle dispersion.

Preparation of Dispersion for Electron Auxiliary Layer

Preparation Example 1

In a flask, 0.06 mg of $Cs_2CO_3$ is added to 6 mL of ethanol and stirred with a magnetic bar overnight (6 hours or more) to prepare a $Cs_2CO_3$ solution (an additive solution, concentration 0.01 mg/mL). The $Zn_{0.85}Mg_{0.15}O$ nanoparticle dispersion of Synthesis Example 4 and the $Cs_2CO_3$ solution are mixed in a volume ratio of 12:1, respectively, to prepare a dispersion for an electron auxiliary layer.

Preparation Example 2

Dispersion for an electron auxiliary layer is prepared according to the method as Preparation Example 1 except that the $Zn_{0.85}Mg_{0.15}O$ nanoparticle dispersion and the $Cs_2CO_3$ solution are mixed in a volume ratio of 6:1.

Preparation Example 3

Dispersion for an electron auxiliary layer is prepared according to the method as Preparation Example 1 except that the $Zn_{0.85}Mg_{0.15}O$ nanoparticle dispersion and the $Cs_2CO_3$ solution are mixed in a volume ratio of 5:1.

Preparation Example 4

Dispersion for an electron auxiliary layer is prepared according to the method as Preparation Example 1 except that the $Zn_{0.85}Mg_{0.15}O$ nanoparticle dispersion and the $Cs_2CO_3$ solution are mixed in a volume ratio of 4:1.

Preparation Example 5

Dispersion for an electron auxiliary layer is prepared according to the method as Preparation Example 1 except that the $Zn_{0.85}Mg_{0.15}O$ nanoparticle dispersion and the $Cs_2CO_3$ solution are mixed in a volume ratio of 3.5:1.

Preparation Example 6

Dispersion for an electron auxiliary layer is prepared according to the method as Preparation Example 1 except that the $Zn_{0.85}Mg_{0.15}O$ nanoparticle dispersion and the $Cs_2CO_3$ solution are mixed in a volume ratio of 3:1.

Preparation Example 7

Dispersion for an electron auxiliary layer is prepared according to the method as Preparation Example 1 except that the $Zn_{0.85}Mg_{0.15}O$ nanoparticle dispersion and the $Cs_2CO_3$ solution are mixed in a volume ratio of 2.5:1.

Preparation Example 8

Dispersion for an electron auxiliary layer is prepared according to the method as Preparation Example 1 except that the $Zn_{0.85}Mg_{0.15}O$ nanoparticle dispersion and the $Cs_2CO_3$ solution are mixed in a volume ratio of 2:1.

Preparation Example 9

Dispersion for an electron auxiliary layer is prepared according to the method as Preparation Example 1 except that the $Zn_{0.85}Mg_{0.15}O$ nanoparticle dispersion and the $Cs_2CO_3$ solution are mixed in a volume ratio of 16:1.

Preparation Example 10

In a flask, 0.06 mg of $Rb_2CO_3$ is added to 6 ml of ethanol and stirred with a magnetic bar overnight (6 hours or more) to prepare a $Rb_2CO_3$ solution. The $Zn_{0.85}Mg_{0.15}O$ nanoparticle dispersion of Synthesis Example 4 and the $Rb_2CO_3$ solution are mixed in a volume ratio of 12:1 to prepare dispersion for an electron auxiliary layer.

Preparation Example 11

In a flask, 0.06 mg of $Rb_2CO_3$ is added to 6 ml of ethanol and stirred with a magnetic bar overnight (6 hours or more) to prepare a $Rb_2CO_3$ solution. The $Zn_{0.85}Mg_{0.15}O$ nanoparticle dispersion of Synthesis Example 4 and the $Rb_2CO_3$ solution are mixed in a volume ratio of 5:1 to prepare dispersion for an electron auxiliary layer.

Preparation Example 12

In a flask, 0.06 mg of $Cs_2CO_3$ is added to 6 ml of ethanol and stirred with a magnetic bar overnight (6 hours or more) to prepare a $Cs_2CO_3$ solution. In a flask, 0.06 mg of $Rb_2CO_3$ is added to 6 ml of ethanol and stirred with a magnetic bar overnight (6 hours or more) to prepare an $Rb_2CO_3$ solution. The $Cs_2CO_3$ solution and the $Rb_2CO_3$ solution are mixed in a mole ratio of 2:3 to prepare a mixed solution. The $Zn_{0.85}Mg_{0.15}O$ nanoparticle dispersion of Synthesis Example 4 and the mixed solution are mixed in a volume ratio of 5:1 to prepare dispersion for an electron auxiliary layer.

Comparative Preparation Example 1

Dispersion for an electron auxiliary layer is prepared according to the method as Preparation Example 1 except that the $Zn_{0.85}Mg_{0.15}O$ nanoparticle dispersion of Synthesis Example 4 alone is present without the $Cs_2CO_3$ solution.

Comparative Preparation Example 2

Dispersion for an electron auxiliary layer is prepared by using the ZnO nanoparticle dispersion of Comparative Synthesis Example 1 without the $Cs_2CO_3$ solution.

Comparative Preparation Example 3

Dispersion for an electron auxiliary layer is prepared according to the same method as Preparation Example 1 except that the ZnO nanoparticle dispersion of Comparative Synthesis Example 1 is used instead of the $Zn_{0.85}Mg_{0.15}O$ nanoparticle dispersion of Synthesis Example 4.

Formation of Thin Film

To evaluate the properties of the thin films according to a content of the additive, $Cs_2CO_3$, sample thin films are formed.

Example 1-1

The dispersion for an electron auxiliary layer according to Preparation Example 1 is spin-coated on a Si substrate and heat-treated at 80° C. for 30 minutes to form a 30 nm thin film.

Example 1-2

A thin film is formed according to the method as Example 1-1 except that the dispersion for an electron auxiliary layer according to Preparation Example 2 is used instead of the dispersion for an electron auxiliary layer according to Preparation Example 1.

Example 1-3

A thin film is formed according to the method as Example 1-1 except that the dispersion for an electron auxiliary layer according to Preparation Example 3 is used instead of the dispersion for an electron auxiliary layer according to Preparation Example 1.

Example 1-4

A thin film is formed according to the method as Example 1-1 except that the dispersion for an electron auxiliary layer according to Preparation Example 4 is used instead of the dispersion for an electron auxiliary layer according to Preparation Example 1.

Example 1-5

A thin film is formed according to the method as Example 1-1 except that the dispersion for an electron auxiliary layer according to Preparation Example 5 is used instead of the dispersion for an electron auxiliary layer according to Preparation Example 1.

Example 1-6

A thin film is formed according to the method as Example 1-1 except that the dispersion for an electron auxiliary layer according to Preparation Example 6 is used instead of the dispersion for an electron auxiliary layer according to Preparation Example 1.

Example 1-7

A thin film is formed according to the method as Example 1-1 except that the dispersion for an electron auxiliary layer according to Preparation Example 7 is used instead of the dispersion for an electron auxiliary layer according to Preparation Example 1.

Example 1-8

A thin film is formed according to the method as Example 1-1 except that the dispersion for an electron auxiliary layer according to Preparation Example 8 is used instead of the dispersion for an electron auxiliary layer according to Preparation Example 1.

Example 1-9

A thin film is formed according to the method as Example 1-1 except that the dispersion for an electron auxiliary layer according to Preparation Example 9 is used instead of the dispersion for an electron auxiliary layer according to Preparation Example 1.

Comparative Example 1

A thin film is formed according to the method as Example 1-1 except that the dispersion for an electron auxiliary layer according to Comparative Preparation Example 1 is used instead of the dispersion for an electron auxiliary layer according to Preparation Example 1.

Evaluation I

The thin films of Examples and Comparative Examples are analyzed by using X-ray photoelectron spectroscopy (XPS, Quantum2000, Physical Electronics, Inc.) and ultraviolet (UV) photoelectron spectroscopy (UPS, Versaprobe, Physical electronics, Inc.).

Tables 1 and 2 show the types and constitution ratios of elements in the thin films.

TABLE 1

| Peak Intensity | Mg2p | Zn2p3/2 | Cs3d5/2 |
|---|---|---|---|
| Example 1-1 | 2.91 | 26.99 | 0.08 |
| Example 1-2 | 3.65 | 24.35 | 1.25 |
| Example 1-6 | 2.39 | 23.83 | 1.87 |
| Comparative Example 1 | 3.75 | 27.55 | — |

TABLE 2

| | Cs concentration (at %) in the thin film |
|---|---|
| Example 1-1 | 0.04 |
| Example 1-2 | 0.07 |
| Example 1-3 | 0.09 |
| Example 1-4 | 0.11 |
| Example 1-5 | 0.125 |
| Example 1-6 | 0.14 |
| Example 1-7 | 0.166 |
| Example 1-8 | 0.20 |
| Example 1-9 | 0.03 |
| Comparative Example 1 | 0 |

Referring to positions and intensity of XPS peaks in the X-ray photoelectron spectroscopy results listed in Table 1, the $Cs_2CO_3$, in the films of Examples is mixed with the inorganic nanoparticles with little or no chemical structural or electronic change with the nanoparticles.

Table 3 shows work functions and HOMO energy levels of the thin films.

TABLE 3

| | Work function (eV) | HOMO (eV) | LUMO (eV) |
|---|---|---|---|
| Example 1-1 | 3.32 | 7.58 | 3.18 |
| Example 1-2 | 3.18 | 7.54 | 3.14 |
| Example 1-6 | 3.11 | 7.36 | 2.96 |
| Comparative Example 1 | 3.33 | 7.59 | 3.19 |

Referring to Table 3, the thin films of Examples include the $Cs_2CO_3$ and show varying work functions dependent upon the content of $Cs_2CO_3$. As a content of the $Cs_2CO_3$ or (Cs content) is increased (corresponding to a decrease in volume ratio), the work functions become shallower. Since a shallow work function corresponds to a greater possibility of discharging free electrons, that is, injecting and/or transporting the free electrons with low energy, electron injection properties and/or electron transport characteristics may be improved.

Manufacture of EODs

In order to evaluate electrical properties of the electronic auxiliary layer, sample EODs (electron-only devices) are manufactured.

Example 2-1

A glass substrate on which ITO (work function: 4.8 eV) is deposited is surface-treated for 15 minutes with UV-ozone. The dispersion for an electron auxiliary layer of Preparation Example 1 is spin-coated on the ITO and heat-treated at 80° C. for 30 minutes to form a 30 nm-thick lower electron auxiliary layer for testing a hole blocking property. The ZnTeSe core/ZnSeS shell quantum dot dispersion obtained in Synthesis Example 1 is spin-coated on the lower electron auxiliary layer and heat-treated at 80° C. for 30 minutes to form a 28 nm-thick quantum dot layer. The dispersion for an electron auxiliary layer of Preparation Example 1 is spin-coated on the quantum dot layer, and heat-treated at 80° C. for 30 minutes to form a 30 nm-thick upper electron auxiliary layer for testing an electron transport property. On the upper electron auxiliary layer, aluminum (Al) is vacuum-deposited to form a 100 nm-thick second electrode (work function: 4.2 eV) to provide an EOD.

Example 2-2

EOD is manufactured according to the method as Example 2-1 except that the dispersion for an electron auxiliary layer of Preparation Example 3 instead of the dispersion for an electron auxiliary layer of Preparation Example 1 is used to form lower and upper electron auxiliary layers.

Example 2-3

EOD is manufactured according to the method as Example 2-1 except that the dispersion for an electron auxiliary layer of Preparation Example 4 instead of the dispersion for an electron auxiliary layer of Preparation Example 1 is used to form lower and upper electron auxiliary layers.

Example 2-4

EOD is manufactured according to the method as Example 2-1 except that the dispersion for an electron auxiliary layer of Preparation Example 5 instead of the dispersion for an electron auxiliary layer of Preparation Example 1 is used to form lower and upper electron auxiliary layers.

Example 2-5

EOD is manufactured according to the method as Example 2-1 except that the dispersion for an electron auxiliary layer of Preparation Example 6 instead of the dispersion for an electron auxiliary layer of Preparation Example 1 is used to form lower and upper electron auxiliary layers.

Example 2-6

EOD is manufactured according to the method as Example 2-1 except that the dispersion for an electron auxiliary layer of Preparation Example 7 instead of the dispersion for an electron auxiliary layer of Preparation Example 1 is used to form lower and upper electron auxiliary layers.

Example 2-7

EOD is manufactured according to the method as Example 2-1 except that the dispersion for an electron auxiliary layer of Preparation Example 8 instead of the dispersion for an electron auxiliary layer of Preparation Example 1 is used to form lower and upper electron auxiliary layers.

Example 2-8

EOD is manufactured according to the method as Example 2-1 except that the dispersion for an electron auxiliary layer of Preparation Example 10 instead of the dispersion for an electron auxiliary layer of Preparation Example 1 is used to form lower and upper electron auxiliary layers.

Example 2-9

EOD is manufactured according to the method as Example 2-1 except that the dispersion for an electron auxiliary layer of Preparation Example 11 instead of the dispersion for an electron auxiliary layer of Preparation Example 1 is used to form lower and upper electron auxiliary layers.

Comparative Example 2-1

EOD is manufactured according to the method as Example 2-1 except that the dispersion for an electron auxiliary layer of Comparative Preparation Example 1 instead of the dispersion for an electron auxiliary layer of Preparation Example 1 is used to form lower and upper electron auxiliary layers.

Comparative Example 2-2

EOD is manufactured according to the method as Example 2-1 except that the dispersion for an electron auxiliary layer of Comparative Preparation Example 2 instead of the dispersion for an electron auxiliary layer of Preparation Example 1 is used to form lower and upper electron auxiliary layers.

Comparative Example 2-3

EOD is manufactured according to the method as Example 2-1 except that the dispersion for an electron auxiliary layer of Comparative Preparation Example 3 instead of the dispersion for an electron auxiliary layer of Preparation Example 1 is used to form lower and upper electron auxiliary layers.

Evaluation II

The electrical properties of the electronic auxiliary layer are evaluated from the current density of EODs according to Examples and Comparative Examples.

Current characteristics are evaluated using a Keithley SMU2635B current source and Minolta CS-2000A spectroradiometer. The results are shown in Table 4.

TABLE 4

|  | Current density (mA/cm², @12 V) |
| --- | --- |
| Example 2-1 | 26.8 |
| Example 2-2 | 47.8 |
| Example 2-3 | 43.4 |
| Example 2-4 | 268 |
| Example 2-5 | 354 |
| Example 2-6 | 114 |
| Example 2-7 | 61 |
| Example 2-8 | 33.9 |
| Example 2-9 | 69.8 |
| Comparative Example 2-1 | 8.4 |

Referring to Table 4, EOD according to Examples exhibit improved electrical properties compared with EOD according to Comparative examples.

Evaluation III

The Transport Layer Optimum Factors (TLOFs) of the electronic auxiliary layer in the EODs according to Examples and Comparative Examples are evaluated.

TLOFs are calculated by the Equation 1A-1. Herein, unit area ($cm^2$) in current density and unit area ($m^2$) in luminance are cancelled out and the results are shown in Table 5.

TABLE 5

|  | Current (mA)(@ 8 V) | Hole Leakage ($10^{-4}$ Cd) | TLOF |
| --- | --- | --- | --- |
| Example 2-2 | 118 | $1.2 \times 10^{-3}$ | 5.99 |
| Example 2-9 | 188.8 | $1.0 \times 10^{-3}$ | 6.28 |
| Comparative Example 2-1 | 20 | $3.3 \times 10^{-3}$ | 4.78 |
| Comparative Example 2-2 | 625 | 2.1 | 3.47 |
| Comparative Example 2-3 | 630 | 3.6 | 3.24 |

Referring to Table 5, the EODs according to Examples exhibit higher TLOF compared with the EODs according to Comparative Examples. Accordingly, it is confirmed that the electron auxiliary layer in the EODs according to Examples may satisfy both electron transport property and hole blocking property compared with the electron auxiliary layer in the EODs according to Comparative examples. In particular, while the EODs according to Comparative Examples 2-2 and 2-3 satisfy high electron transport property, they have also relatively high hole leakage, as a result, the TLOF of each comparative example are much lower than the EODs according to Examples.

Manufacture of Blue Light Emitting Quantum Dot Device I

Example 3

A glass substrate deposited with ITO (work function: 4.8 eV) is surface-treated with UV-ozone for 15 minutes, and a PEDOT:PSS solution (H.C. Starks) is spin-coated thereon and heated treated at 150° C. under an air atmosphere for 10 minutes and at 150° C. under a $N_2$ atmosphere for 30 minutes to form a 30 nm-thick lower hole auxiliary layer (HOMO: 5.3 eV, LUMO: 2.7 eV). On the lower hole auxiliary layer, a poly[(9,9-dioctyl fluoren-2,7-diyl-co-(4,4'-(N-4-butylphenyl)diphenyl amine] solution (TFB) (Sumitomo Corp.) is spin-coated and heat-treated at 150° C. for 30 minutes to form a 25 nm-thick upper hole auxiliary layer (HOMO: 5.6 eV, LUMO: 2.69 eV). On the upper hole auxiliary layer, the halogen-treated ZnTeSe/ZnSeS core/shell quantum dot dispersion (peak emission wavelength: 453 nm) of Synthesis Example 2 is spin-coated and heat-treated at 80° C. for 30 minutes to form a 28 nm-thick lower quantum dot layer (HOMO: 5.9 eV, LUMO: 3.2 eV). On the lower quantum dot layer, the halogen-treated ZnTeSe/ZnSeS core/shell quantum dot dispersion of Synthesis Example 2 is spin-coated and heat-treated at 80° C. for 30 minutes to form a 13 nm-thick upper quantum dot layer. On the upper quantum dot layer, the dispersion for an electron auxiliary layer of Preparation Example 3 is spin-coated and heat-treated at 80° C. for 30 minutes to form a 20 nm-thick electron auxiliary layer. On the electron auxiliary layer, aluminum (Al) is vacuum-deposited to form a 100 nm-thick second electrode (work function: 4.2 eV) to provide a quantum dot device.

Comparative Example 3

A quantum dot device is manufactured according to the method as Example 3 except that the dispersion for an electron auxiliary layer according to Comparative Preparation Example 1 is used instead of the dispersion for an electron auxiliary layer according to Preparation Example 3 to form an electron auxiliary layer.

Example 4

A quantum dot device is manufactured according to the method as Example 3 except for forming a 20 nm-thick lower quantum dot layer and a 20 nm-thick upper quantum dot layer instead of the 28 nm-thick lower quantum dot layer and the 13 nm-thick upper quantum dot layer.

Example 5

A quantum dot device is manufactured according to the method as Example 4 except that the dispersion for an electron auxiliary layer according to Preparation Example 11 is used instead of the dispersion for an electron auxiliary layer according to Preparation Example 3 to form an electron auxiliary layer.

Example 6

A quantum dot device is manufactured according to the method as Example 4 except that the dispersion for an electron auxiliary layer according to Preparation Example 12 is used instead of the dispersion for an electron auxiliary layer according to Preparation Example 3 to form an electron auxiliary layer.

Comparative Example 4

A quantum dot device is manufactured according to the method as Example 4 except that the dispersion for an electron auxiliary layer according to Comparative Preparation Example 1 is used instead of the dispersion for an electron auxiliary layer according to Preparation Example 3 to form an electron auxiliary layer.

Evaluation IV

The performance of blue light emitting quantum dot devices according to Examples and Comparative Examples is evaluated.

The current-voltage-luminescence characteristics are evaluated using a Keithley SMU2635B current source and Minolta CS-2000A spectroradiometer.

The external quantum efficiency (EQE) is evaluated with maximum external quantum efficiency.

Life-span characteristics of the quantum dot devices are evaluated by measuring a luminance decrease relative to initial luminance, while currents for conditions that show 650 nits (a blue quantum dot device) and 4500 nits (a red quantum dot device), and $T_{50}$ is a time when a 50% luminance relative to the initial luminance occurs.

The results are shown in Tables 6 and 7.

TABLE 6

| | $EQE_{max}$ (%) | $Lum_{max}$ (nits) | $Cd/A_{max}$ | $Cd/m^2$ @5 mA | V@1000 nits (V) | $\lambda_{max}$ (nm) |
|---|---|---|---|---|---|---|
| Example 3 | 10.5 | 43590 | 7.5 | 375 | 3.6 | 453 |
| Comparative Example 3 | 5.8 | 30380 | 4.3 | 213 | 3.6 | 452 |

TABLE 7

| | $EQE_{max}$ (%) | $Lum_{max}$ (nits) | $Cd/A_{max}$ | $Cd/m^2$ @5 mA | V@1000 nit(V) | $\lambda_{max}$ (nm) | $T_{90}$ (h) |
|---|---|---|---|---|---|---|---|
| Example 4 | 11.7 | 62350 | 13.8 | 673 | 3.4 | 466 | 7.9 |
| Example 5 | 11.8 | 68770 | 12.5 | 622 | 3.6 | 466 | 17.5 |
| Example 6 | 11.9 | 64560 | 13.5 | 665 | 3.6 | 466 | 10 |
| Comparative Example 4 | 7.7 | 40550 | 10.1 | 468 | 3.5 | 466 | 6.8 |

* $EQE_{max}$: maximum external quantum efficiency
* $Lum_{max}$: maximum luminance
* $Cd/A_{max}$: maximum current efficiency
* $Cd/m^2$@5 mA: luminance at 5 mA
* V@1000 nits: voltage for driving at 1000 nit
* $\lambda_{max}$: maximum light emitting wavelength
* $T_{50}$: the time at which a luminance of 50% occurs with respect to the initial luminance
* $T_{90}$: the time at which a luminance of 90% occurs with respect to the initial luminance Referring to Tables 6 and 7, the quantum dot devices according to Examples exhibit improved electrical properties, luminescence characteristics, and life-span characteristics compared with the quantum dot devices according to Comparative Examples.

Manufacture of Blue Light Emitting Quantum Dot Device II

Example 7

A glass substrate deposited with ITO (work function: 4.8 eV) is surface-treated with UV-ozone for 15 minutes, and a PEDOT:PSS solution (H.C. Starks) is spin-coated thereon and heated treated at 150° C. under an air atmosphere for 10 minutes and at 150° C. under a $N_2$ atmosphere for 30 minutes to form a 30 nm-thick lower hole auxiliary layer (HOMO: 5.3 eV, LUMO: 2.7 eV). On the lower hole auxiliary layer, a poly[(9,9-dioctyl fluoren-2,7-diyl-co-(4,4'-(N-4-butylphenyl)diphenyl amine] solution (TFB) (Sumitomo Corp.) is spin-coated and heat-treated at 150° C. for 30 minutes to form a 25 nm-thick upper hole auxiliary layer (HOMO: 5.6 eV, LUMO: 2.69 eV). On the upper hole auxiliary layer, the halogen-treated ZnTeSe/ZnSeS core/shell quantum dot dispersion (peak emission wavelength: 453 nm) of Synthesis Example 2 is spin-coated and heat-treated at 80° C. for 30 minutes to form a 20 nm-thick lower (or first) quantum dot layer (HOMO: 5.9 eV, LUMO: 3.2 eV). On the lower quantum dot layer, the halogen-treated ZnTeSe/ZnSeS core/shell quantum dot dispersion of Synthesis Example 2 is spin-coated and heat-treated at 80° C. for 30 minutes to form a 13 nm-thick middle (or second) quantum dot layer. On the middle quantum dot layer, the ZnTeSe/ZnSeS core/shell quantum dot dispersion of Synthesis Example 1 is spin-coated and heat-treated at 80° C. for 30 minutes to form a 13 nm-thick upper (or third) quantum dot layer. On the upper quantum dot layer, the dispersion for an electron auxiliary layer of Preparation Example 3 is spin-coated and heat-treated at 80° C. for 30 minutes to form a 20 nm-thick electron auxiliary layer. On the electron auxiliary layer, aluminum (Al) is vacuum-deposited to form a 100 nm-thick second electrode (work function: 4.2 eV) to provide a quantum dot device.

Example 8

A quantum dot device is manufactured according to the method as Example 7 except that the dispersion for an electron auxiliary layer according to Preparation Example 10 is used instead of the dispersion for an electron auxiliary layer according to Preparation Example 3 to form an electron auxiliary layer.

Comparative Example 5

A quantum dot device is manufactured according to the method as Example 7 except that the dispersion for an electron auxiliary layer according to Comparative Preparation Example 2 is used instead of the dispersion for an electron auxiliary layer according to Preparation Example 3 to form an electron auxiliary layer.

Evaluation V

The performance of blue light emitting quantum dot devices according to Examples and Comparative Examples is evaluated. The results are shown in Table 8.

TABLE 8

| | $EQE_{max}$ (%) | $Lum_{max}$ (nits) | $EQE_{5000\,nit}$ (%) | $EQE_{20000\,nit}$ (%) | $\lambda_{max}$ (nm) | $T_{90}$ (hr) |
|---|---|---|---|---|---|---|
| Example 7 | 13.8 | 74220 | 13.3 | 8.8 | 468 | 21.5 |
| Example 8 | 12.4 | 78513 | 11.0 | 7.4 | 469 | 27.3 |
| Comp. Example 5 | 8.7 | 50663 | 8.4 | 5.2 | 468 | 11.1 |

* $EQE_{5000\,nit}$: external quantum efficiency at 5000 nit,
* $EQE_{20000\,nit}$: external quantum efficiency at 20000 nit Referring to Table 8, the quantum dot devices according to Examples exhibit improved electrical properties, luminescence characteristics, and life-span characteristics compared with the quantum dot devices according to Comparative Examples.

Manufacture of Red Light Emitting Quantum Dot Device

Example 9

A quantum dot device is manufactured according to the method as Example 3 except that the InP core/ZnSe shell/ZnS shell quantum dot dispersion of Synthesis Example 3 is used instead of the ZnTeSe/ZnSeS core shell quantum dot dispersion of Synthesis Example 2 to form a 20 nm-thick single quantum dot layer, and the dispersion for an electron auxiliary layer according to Preparation Example 9 is used instead of the dispersion according to Preparation Example 3.

Comparative Example 6

A quantum dot device is manufactured according to the same method as Example 9 except that the dispersion for an electron auxiliary layer according to Comparative Preparation Example 1 is used instead of the dispersion for an electron auxiliary layer according to Preparation Example 9 to form an electron auxiliary layer.

Evaluation VI

The performance of red light emitting quantum dot devices according to Examples and Comparative Examples is evaluated. The results are shown in Table 9.

TABLE 9

| | $EQE_{max}$ (%) | $Lum_{max}$ (nits) | $Cd/A_{max}$ | $Cd/m^2$ @5 mA | V@1000 nit(V) | $\lambda_{max}$ (nm) |
|---|---|---|---|---|---|---|
| Example 9 | 18.3 | 123700 | 21.2 | 1057 | 3.0 | 631 |
| Comparative Example 6 | 16.2 | 106440 | 18.5 | 921 | 2.9 | 631 |

Referring to Table 9, the quantum dot device according to Example exhibits improved electrical and luminance characteristics compared with the quantum dot device according to Comparative Example.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot device comprising
a first electrode and a second electrode each having a surface opposite the other,
a quantum dot layer disposed between the first electrode and the second electrode, and
an electron auxiliary layer disposed between the quantum dot layer and the second electrode,
wherein the electron auxiliary layer comprises
inorganic nanoparticles comprising an alkaline-earth metal, and
an alkali metal, an alkali metal compound, or a combination thereof.

2. The quantum dot device of claim 1, wherein a work function of the electron auxiliary layer is shallower than a work function of the inorganic nanoparticles, wherein the work function is measured as a film.

3. The quantum dot device of claim 2, wherein the work function of the electron auxiliary layer is about 0.01 eV to about 0.7 eV shallower than the work function of the inorganic nanoparticles.

4. The quantum dot device of claim 2, wherein as a content of total alkali metal increases, the work function of the electron auxiliary layer becomes more shallower.

5. The quantum dot device of claim 1, wherein
the alkali metal comprises lithium, sodium, potassium, cesium, rubidium, francium, or a combination thereof, and
the alkaline-earth metal comprises beryllium, magnesium, calcium, barium, strontium, radium, or a combination thereof.

6. The quantum dot device of claim 1, wherein total alkali metal is present in an amount of less than about 0.5 atomic percent in the electron auxiliary layer.

7. The quantum dot device of claim 1, wherein a total alkali metal is present in an amount of about 0.01 atomic percent to about 0.2 atomic percent, based on a total number of atoms in the electron auxiliary layer.

8. The quantum dot device of claim 1, wherein the alkali metal or the alkali metal compound present in the electron auxiliary layer is derived from an alkali carbonate.

9. The quantum dot device of claim 1, wherein
the inorganic nanoparticles are metal oxide nanoparticles, and
the alkaline-earth metal is present in about 0.01 atomic percent to about 30 atomic percent, based on the total number of metal atoms present in the metal oxide nanoparticles.

10. The quantum dot device of claim 1, wherein the inorganic nanoparticles are metal oxide nanoparticles comprising the alkaline-earth metal and zinc.

11. The quantum dot device of claim 1, wherein a mole fraction of the alkaline-earth metal is greater than a mole fraction of total alkali metal in the electron auxiliary layer, as measured by X-ray photoelectron spectroscopy.

12. The quantum dot device of claim 11, wherein a mole ratio of the alkaline-earth metal relative to the total alkali metal in the electron auxiliary layer is greater than or equal to about 1.2:1.

13. The quantum dot device of claim 11, wherein the electron auxiliary layer satisfies with the Equation 1A-1:

$$\log(ET/HL) \geq 5.50 \qquad \text{Equation 1A-1}$$

wherein in Equation 1A-1,
ET is an amount of electrons per unit area in square centimeters that transport through the electron auxiliary layer, and
HL is an amount of holes per unit area in square meters that pass through the electron auxiliary layer.

14. The quantum dot device of claim 1, wherein a thickness of the electron auxiliary layer is less than or equal to about 60 nanometers.

15. A quantum dot device comprising
a first electrode and a second electrode each having a surface opposite the other,
a quantum dot layer disposed between the first electrode and the second electrode, the quantum dot layer comprising quantum dots configured to emit light in at least a portion of a wavelength region of a visible wavelength region, and
an electron auxiliary layer disposed between the quantum dot layer and the second electrode, wherein the electron auxiliary layer comprises
an alkaline-earth metal, and
an alkali metal, an alkali metal compound, or a combination thereof,
wherein a total alkali metal is present in an amount of less than about 0.5 atomic percent in the electron auxiliary layer based on the total number of atoms in the electron auxiliary layer.

16. The quantum dot device of claim 15, wherein the alkali metal comprises lithium, sodium, potassium, cesium, rubidium, francium, or a combination thereof.

17. The quantum dot device of claim 15, wherein the alkali metal or the alkali metal compound is derived from cesium carbonate, cesium phosphate, cesium vanadate, cesium azide, lithium carbonate, lithium nitride, sodium carbonate, potassium carbonate, rubidium carbonate, or a combination thereof.

18. The quantum dot device of claim 15, wherein the electron auxiliary layer further comprises zinc.

19. The quantum dot device of claim 18, wherein the electron auxiliary layer comprises metal oxide nanoparticles comprising the alkaline-earth metal and the zinc.

20. The quantum dot device of claim 19, wherein a mole ratio of the alkaline-earth metal to the zinc in the metal oxide nanoparticles is about 0.01:1 to about 0.5:1.

21. The quantum dot device of claim 19, wherein the alkaline-earth metal is present in the metal oxide nanoparticles in an amount of about 0.01 atomic percent to about 30 atomic percent, based on a total atom number of the alkaline-earth metal and the zinc.

22. The quantum dot device of claim 19, wherein a work function of the electron auxiliary layer is shallower than a work function of the metal oxide nanoparticles, wherein the work function is measured as a film.

23. The quantum dot device of claim 19, wherein as a content of total alkali metal in the electron auxiliary layer increases the work function of the electron auxiliary layer becomes more shallower.

24. The quantum dot device of claim 15, wherein the total alkali metal in the electron auxiliary layer is present in about 0.01 atomic percent to about 0.2 atomic percent, based on a total number of atoms in the electron auxiliary layer.

25. The quantum dot device of claim 15, wherein the electron auxiliary layer satisfies with the Equation 1A-1:

$$\log(ET/HL) \geq 5.50 \qquad \text{Equation 1A-1}$$

wherein in Equation 1A-1,
ET is an amount of electrons per unit area in square centimeters that transport through the electron auxiliary layer, and
HL is an amount of holes per unit area in square meters that pass through the electron auxiliary layer.

26. A quantum dot device comprising
a first electrode and a second electrode each having a surface opposite the other,
a quantum dot layer disposed between the first electrode and the second electrode, and
an electron auxiliary layer disposed between the quantum dot layer and the second electrode,
wherein the electron auxiliary layer satisfies the Equation 1A-1:

$$\log(ET/HL) \geq 5.50 \qquad \text{Equation 1A-1}$$

In Equation 1A-1,
ET is an amount of electrons per unit area in square centimeters that transport through the electron auxiliary layer, and
HL is an amount of holes per unit area in square meters that pass through the electron auxiliary layer.

27. The quantum dot device of claim 26, wherein the electron auxiliary layer satisfies the Equation 1A-3:

$$\log(ET/HL) \geq 5.90 \qquad \text{Equation 1A-3}$$

wherein in Equation 1A-3,
ET is an amount of electrons per unit area in square centimeters that transport through the electron auxiliary layer, and
HL is an amount of holes per unit area in square meters that pass through the electron auxiliary layer.

28. An electronic device comprising the quantum dot device of claim 1.

29. An electronic device comprising the quantum dot device of claim 15.

30. An electronic device comprising the quantum dot device of claim 26.

* * * * *